(12) United States Patent
Nishio et al.

(10) Patent No.: US 9,716,186 B2
(45) Date of Patent: Jul. 25, 2017

(54) SEMICONDUCTOR DEVICE MANUFACTURING METHOD, AND SEMICONDUCTOR DEVICE

(71) Applicant: Kabushiki Kaisha Toshiba, Minato-ku (JP)

(72) Inventors: Johji Nishio, Machida (JP); Tatsuo Shimizu, Shinagawa (JP); Ryosuke Iijima, Setagaya (JP); Teruyuki Ohashi, Kawasaki (JP); Kazuto Takao, Tsukuba (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/875,787

(22) Filed: Oct. 6, 2015

(65) Prior Publication Data
US 2016/0149056 A1    May 26, 2016

(30) Foreign Application Priority Data

Nov. 26, 2014    (JP) ................................. 2014-239332

(51) Int. Cl.
*H01L 29/868*    (2006.01)
*H01L 21/04*    (2006.01)
(Continued)

(52) U.S. Cl.
CPC .......... *H01L 29/868* (2013.01); *H01L 21/046* (2013.01); *H01L 29/1608* (2013.01);
(Continued)

(58) Field of Classification Search
None
See application file for complete search history.

(56) References Cited

U.S. PATENT DOCUMENTS

2008/0026544 A1    1/2008    Tsuchida et al.
2009/0039358 A1*   2/2009    Tsuchida ................. C30B 29/36
                                                        257/77
(Continued)

FOREIGN PATENT DOCUMENTS

EP      1 883 102 A2    1/2008
JP      2008-53667      3/2008
(Continued)

OTHER PUBLICATIONS

Extended European Search Report issued on Mar. 23, 2016 in Patent Application No. 15176154.1.
(Continued)

*Primary Examiner* — Khaja Ahmad
(74) *Attorney, Agent, or Firm* — Oblon, McClelland, Maier & Neustadt, L.L.P.

(57) ABSTRACT

A semiconductor device manufacturing method according to an embodiment includes: forming an n-type SiC layer on a SiC substrate; forming a p-type impurity region at one side of the SiC layer; exposing other side of the SiC layer by removing at least part of the SiC substrate; implanting carbon (C) ions into exposed part of the SiC layer; performing a heat treatment; forming a first electrode on the p-type impurity region; and forming a second electrode on the exposed part of the SiC layer.

12 Claims, 19 Drawing Sheets

(51) Int. Cl.
*H01L 29/16* (2006.01)
*H01L 29/66* (2006.01)
*H01L 29/32* (2006.01)
*H01L 29/861* (2006.01)

(52) U.S. Cl.
CPC .......... *H01L 29/32* (2013.01); *H01L 29/6606* (2013.01); *H01L 29/8611* (2013.01)

(56) References Cited

U.S. PATENT DOCUMENTS

| | | |
|---|---|---|
| 2009/0047772 A1 | 2/2009 | Tsuchida et al. |
| 2009/0224284 A1 | 9/2009 | Nemoto |
| 2010/0173475 A1 | 7/2010 | Tsuchida et al. |
| 2011/0018005 A1 | 1/2011 | Nakano |
| 2012/0223333 A1* | 9/2012 | Mizukami ............ H01L 29/872 257/77 |
| 2013/0183820 A1* | 7/2013 | Hiyoshi ............ H01L 21/3065 438/589 |
| 2013/0277688 A1 | 10/2013 | Nakano |
| 2014/0070230 A1 | 3/2014 | O'Loughlin et al. |
| 2015/0069411 A1* | 3/2015 | Esteve .................... H01L 29/06 257/77 |
| 2016/0005605 A1 | 1/2016 | Nishio et al. |

FOREIGN PATENT DOCUMENTS

| | | |
|---|---|---|
| JP | 2009-49045 | 3/2009 |
| JP | 2009-188336 | 8/2009 |
| JP | 2013-48247 | 3/2013 |
| JP | 2016-18861 | 2/2016 |

OTHER PUBLICATIONS

Liutauras Storasta, et al., "Reduction of traps and improvement of carrier lifetime in 4H-SiC epilayers by ion implantation", Applied Physics Letters, vol. 90, XP012095943, 2007, pp. 062116-1-062116-3.

Toru Hiyoshi, et al., "Reduction of Deep Levels and Improvement of Carrier Lifetime in n-Type 4H-SiC by Thermal Oxidation", Applied Physics Express, vol. 2, XP055193966, 2009, pp. 041101-1-041101-3 and cover page.

Koji Nakayama, et al., "Characteristics of a 4H-SiC Pin Diode With Carbon Implantation/Thermal Oxidation", IEEE Transactions on Electron Devices, vol. 59, No. 4, XP011436555, 2012, pp. 895-901.

U.S. Appl. No. 14/690,968, filed Apr. 20, 2015, Johji Nishio et al.

Liutauras Storasta et al. "Reduction of traps and improvement of carrier lifetime in 4H-SiC epilayers by ion implantation", Applied Physics Letters 90, 2007, 4 pages.

Toru Hiyoshi et al. "Reduction of Deep Levels and Improvement of carrier Lifetime in n-type 4H-SiC by thermal Oxidation", Applied Physics Express 2, 2009, 4 pages.

* cited by examiner

SEMICONDUCTOR DEVICE MANUFACTURING METHOD, AND SEMICONDUCTOR DEVICE

CROSS-REFERENCE TO RELATED APPLICATION

This application is based upon and claims the benefit of priority from Japanese Patent Application No. 2014-239332, filed on Nov. 26, 2014, the entire contents of which are incorporated herein by reference.

FIELD

Embodiments described herein relate generally to a semiconductor device manufacturing method, and a semiconductor device.

BACKGROUND

SiC (silicon carbide) is expected to be a material for next-generation semiconductor devices. SiC has excellent physical properties, having a band gap three times wider than that of Si (silicon), a breakdown field strength approximately 10 times higher than that of Si, and a heat conductivity approximately three times higher than that of Si. A semiconductor device that has low loss and is capable of high-temperature operation can be realized by taking advantage of those properties.

In a bipolar device such as a diode using SiC, the lifetime of minority carriers becomes shorter due to defects such as carbon vacancies. If the lifetime of minority carriers becomes shorter, the rate of decrease in reverse recovery current at a time when the device is turned off becomes higher, resulting in increased noise. This problem is particularly noticeable in cases when the lifetime of minority carriers in the vicinity of an electrode which is close to an edge of a depletion layer is short.

So as to reduce noise at a time when the device is turned off, there is a demand for a lower rate of decrease in reverse recovery current, and realization of soft recovery characteristics.

DETAILED DESCRIPTION

Figure 1:
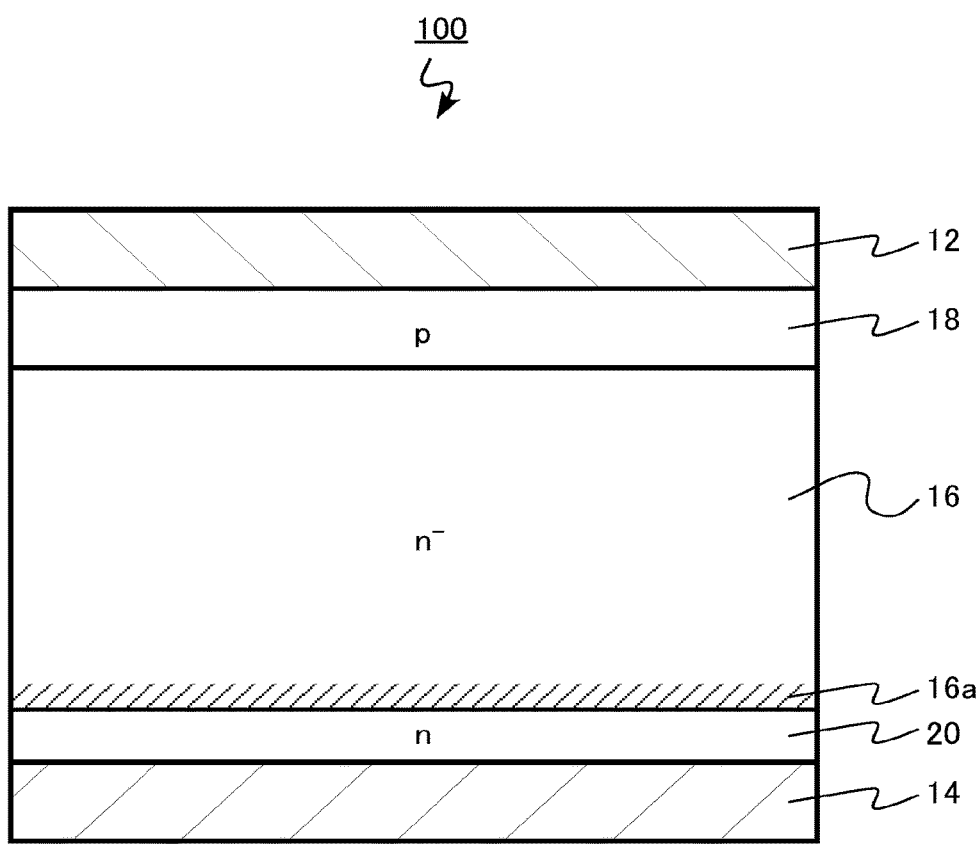
FIG. 1 is a schematic cross-sectional view of a semiconductor device according to a first embodiment.

A semiconductor device manufacturing method according to an embodiment includes: forming an n-type SiC layer on a SiC substrate; forming an n-type SiC layer on a SiC substrate; forming a p-type impurity region at one side of the SiC layer; exposing other side of the SiC layer by removing at least part of the SiC substrate; implanting carbon (C) ions into exposed part of the SiC layer; performing a heat treatment; forming a first electrode on the p-type impurity region; and forming a second electrode on the exposed part of the SiC layer.

The following is a description of embodiments, with reference to the accompanying drawings. In the description below, same or similar components are denoted by same reference numerals, and explanation of components described once will not be repeated.

In the description below, $n^+$, $n$, $n^-$, $p^+$, $p$, and $p^-$ indicate relative levels of impurity concentrations in the respective conductivity types. Specifically, the concentration of an $n^+$-type impurity is relatively higher than the concentration of the corresponding n-type impurity, and the concentration of an $n^-$-type impurity is relatively lower than the concentration of the corresponding n-type impurity. Likewise, the concentration of a $p^+$-type impurity is relatively higher than the concentration of the corresponding p-type impurity, and the concentration of a $p^-$-type impurity is relatively lower than the concentration of the corresponding p-type impurity. It should be noted that there are cases where an $n^+$-type and an $n^-$-type are referred to simply as an n-type, and a $p^+$-type and a $p^-$-type are referred to simply as a p-type.

First Embodiment

A semiconductor device according to this embodiment includes: a first electrode; a second electrode; an n-type SiC layer provided between the first electrode and the second electrode, the SiC layer including a low-carbon-vacancy-concentration region at the second electrode side, a carbon vacancy concentration being minimized in the low-carbon-vacancy-concentration region; and a p-type impurity region provided between the first electrode and the SiC layer.

FIG. 1 is a schematic cross-sectional view showing the structure of a PIN diode that is a semiconductor device according to this embodiment.

This PIN diode 100 includes an anode electrode (the first electrode) 12, a cathode electrode (the second electrode) 14, an $n^-$-type drift layer (the n-type SiC layer) 16, a low-carbon-vacancy-concentration region 16a, a p-type anode region (the p-type impurity region) 18, and an n-type cathode region (an n-type impurity region) 20.

Figure 2:
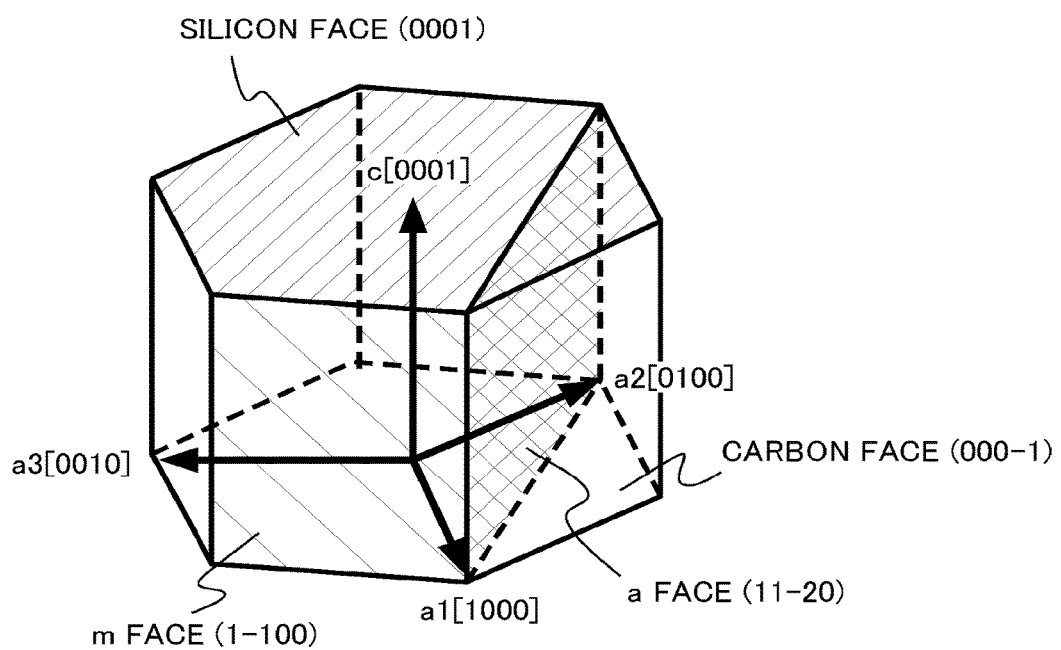
FIG. 2 is a diagram showing a crystalline structure of a SiC semiconductor according to the first embodiment.

FIG. 2 is a diagram showing a crystalline structure of a SiC semiconductor. A typical crystalline structure of a SiC semiconductor is a hexagonal crystal system such as 4H—SiC. One of the faces (the top planes of a hexagonal prism) having the c-axis extending in the axial direction of the hexagonal prism as the normal line is the (0001) face. The face equivalent to the (0001) face is referred to as the silicon face (Si face) and is written as the {0001} face. Si (silicon) is arranged in the silicon face.

The other one of the faces (the top planes of the hexagonal prism) having the c-axis extending in the axial direction of the hexagonal prism as the normal line is the (000-1) face. The face equivalent to the (000-1) face is referred to as the carbon face (C face) and is written as the {000-1} face. C (carbon) is arranged in the carbon face.

Meanwhile, a side face (prismatic plane) of the hexagonal prism is an m face equivalent to the (1-100) face, or is the {1-100} face. The face extending along edge lines that are not adjacent to each other is an a face equivalent to the (11-20) face, or is the {11-20} face. Both Si (silicon) and C (carbon) are arranged in the m face and the a face.

The $n^-$-type drift layer 16 is provided between the anode electrode 12 and the cathode electrode 14. The drift layer 16 is a SiC epitaxially grown layer formed on a SiC substrate (not shown) by epitaxial growth, for example.

The concentration of the n-type impurity in the drift layer 16 is not lower than $5\times10^{14}$ cm$^{-3}$ and not higher than $5\times10^{15}$ cm$^{-3}$, for example. The n-type impurity is N (nitrogen), for example. The thickness of the drift layer 16 is not smaller than 50 μm and not greater than 150 μm, for example.

The surface of the drift layer 16 is a plane tilted zero to eight degrees with respect to the silicon face, for example. A plane tilted zero to eight degrees with respect to the silicon face can be regarded as substantially equivalent to the silicon face in terms of characteristics.

The drift layer 16 has the low-carbon-vacancy-concentration region 16a on the side of the cathode electrode 14. The low-carbon-vacancy-concentration region 16a is the region where the carbon vacancy concentration is minimized in the drift layer 16.

The p-type anode region 18 is provided between the anode electrode 12 and the drift layer 16. The anode region 18 is provided on the surface of the drift layer 16.

The concentration of the p-type impurity in the anode region 18 is not lower than $1\times10^{18}$ cm$^{-3}$ and not higher than $1\times10^{20}$ cm$^{-3}$, for example. The p-type impurity in the anode region 18 is Al (aluminum), for example. Alternatively, the p-type impurity may be B (boron), Ga (gallium), or In (indium).

The depth of the anode region 18 is approximately 0.3 μm, for example. The surface of the anode region 18 is also a plane tilted zero to eight degrees with respect to the silicon face, for example.

The anode electrode 12 is made of a metal, for example. The metal forming the anode electrode 12 is TiN (titanium nitride), for example. Another metal such as Al (aluminum) may be stacked on the TiN. Other than a metal, it is possible to employ an electrically-conductive material such as polycrystalline silicon containing an n-type impurity.

The anode region 18 and the anode electrode 12 are electrically connected.

The n-type cathode region 20 is provided between the drift layer 16 and the cathode electrode 14. The cathode region 20 has the function to lower the contact resistance of the cathode electrode 14.

The n-type impurity concentration in the cathode region 20 is higher than the n-type impurity concentration in the drift layer 16. The concentration of the n-type impurity in the cathode region 20 is not lower than $1\times10^{18}$ cm$^{-3}$ and not higher than $1\times10^{20}$ cm$^{-3}$, for example. The n-type impurity is P (phosphorus), for example. Alternatively, the n-type impurity may be N (nitrogen), for example. The thickness of the cathode region 20 is not smaller than 0.1 μm and not greater than 1 μm, for example.

The surface of the cathode region 20 on the side of the cathode electrode 14 is a plane tilted zero to eight degrees with respect to the carbon face. A plane tilted zero to eight degrees with respect to the carbon face can be regarded as substantially equivalent to the carbon face in terms of characteristics.

The cathode electrode 14 is formed with stacked layers that are a Ni (nickel) barrier metal layer and an Al (aluminum) metal layer formed on the barrier metal layer, for example. The Ni barrier metal layer and the Al metal layer may form an alloy through a reaction. Alternatively, the Ni and the cathode region 20 may form a silicide through a reaction.

The cathode region 20 and the cathode electrode 14 are electrically connected.

Figure 3:
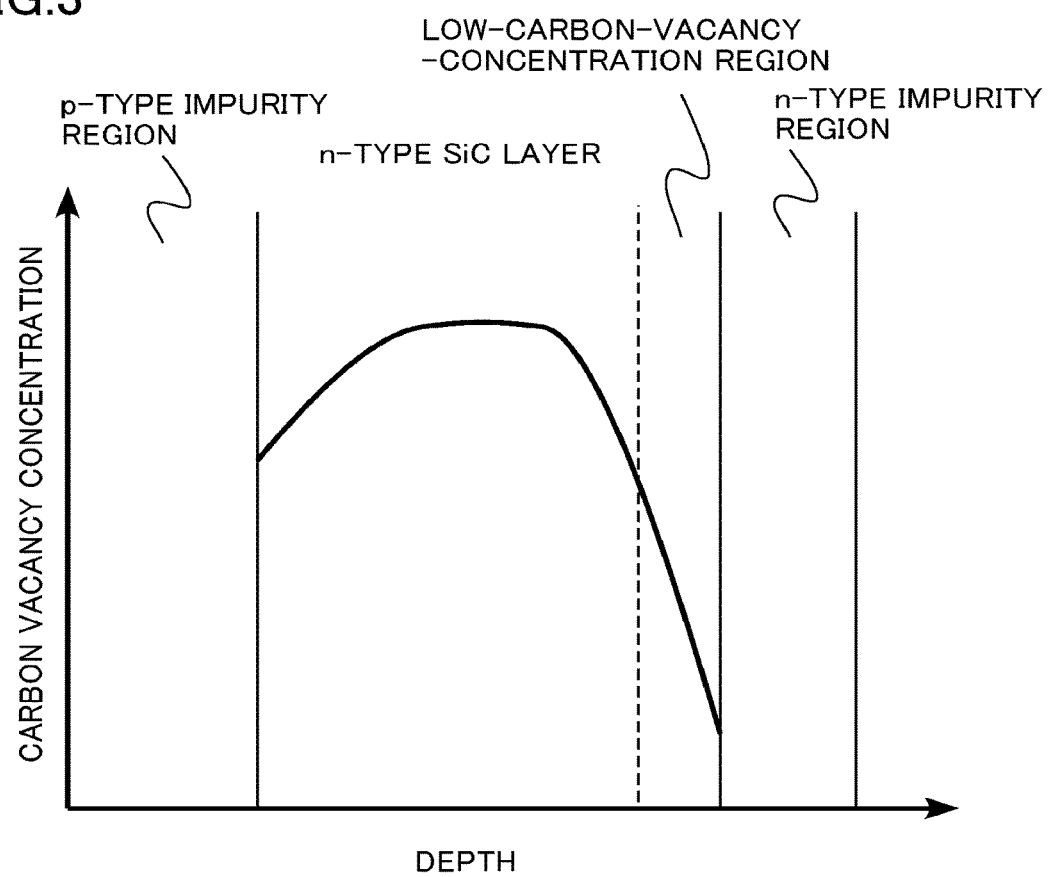
FIG. 3 is a diagram showing the profile of the concentration of carbon vacancies in the semiconductor device according to the first embodiment.

FIG. 3 is a diagram showing the profile of the concentration of carbon vacancies in the semiconductor device according to this embodiment. This diagram shows the profile of the concentration of carbon vacancies in a cross-section including the p-type anode region (p-type impurity region) 18 and the n-type cathode region (n-type impurity region) 20. The concentration of carbon vacancies can be measured by DLTS (Deep Level Transient Spectroscopy). Specifically, the $Z_{1/2}$ concentration measured by DLTS is regarded as the concentration of carbon vacancies, for example.

As shown in FIG. 3, the low-carbon-vacancy-concentration region 16a where the carbon vacancy concentration is minimized is provided in a portion of the n-type drift layer (n-type SiC layer) 16 located on the side of the cathode electrode 14. The carbon vacancy concentration is minimized in the interface between the cathode region 20 and the n-type drift layer 16, for example. In the low-carbon-vacancy-concentration region 16a, the $Z_{1/2}$ level density measured by DLTS is preferably $1 \times 10^{11}$ cm$^{-3}$ or lower. Here, a portion of the drift layer 16 located on the side of the cathode electrode 14 means a location closer to the cathode region 20 than to the middle portion of the drift layer 16 in the thickness direction.

In the low-carbon-vacancy-concentration region 16a, the interstitial carbon concentration is higher than that in any other region in the drift layer 16 of this embodiment. In other words, the PIN diode 100 has the region where the interstitial carbon concentration is maximized in a portion of the n-type drift layer (n-type SiC layer) 16 located on the side of the cathode electrode 14.

Next, a semiconductor device manufacturing method according to this embodiment is described. The semiconductor device manufacturing method according to this embodiment includes: forming an n-type SiC layer on a SiC substrate; forming a p-type impurity region at one side of the SiC layer; exposing other side of the SiC layer by removing at least part of the SiC substrate; implanting carbon (C) ions into exposed part of the SiC layer; performing a heat treatment; forming a first electrode on the p-type impurity region; and forming a second electrode on the exposed part of the SiC layer. The semiconductor device manufacturing method according to this embodiment is an example of a method of manufacturing the semiconductor device shown in FIG. 1.

FIGS. 4 through 10 are schematic cross-sectional views showing the semiconductor device being manufactured by the semiconductor device manufacturing method according to this embodiment.

First, an n$^+$-type SiC substrate 10 is prepared. The SiC substrate 10 is the SiC of 4H—SiC containing N (nitrogen), for example, as the n-type impurity at an impurity concentration not lower than $1 \times 10^{18}$ cm$^{-3}$ and not higher than $1 \times 10^{20}$ cm$^{-3}$, for example. The SiC substrate 10 is a substrate formed by a sublimation technique, for example. The thickness of the SiC substrate 10 is not smaller than 300 µm and not greater than 500 µm, for example.

One of the planes of the SiC substrate 10 is a silicon face, for example. The other one of the planes of the SiC substrate 10 is a carbon face, for example.

Figure 4:
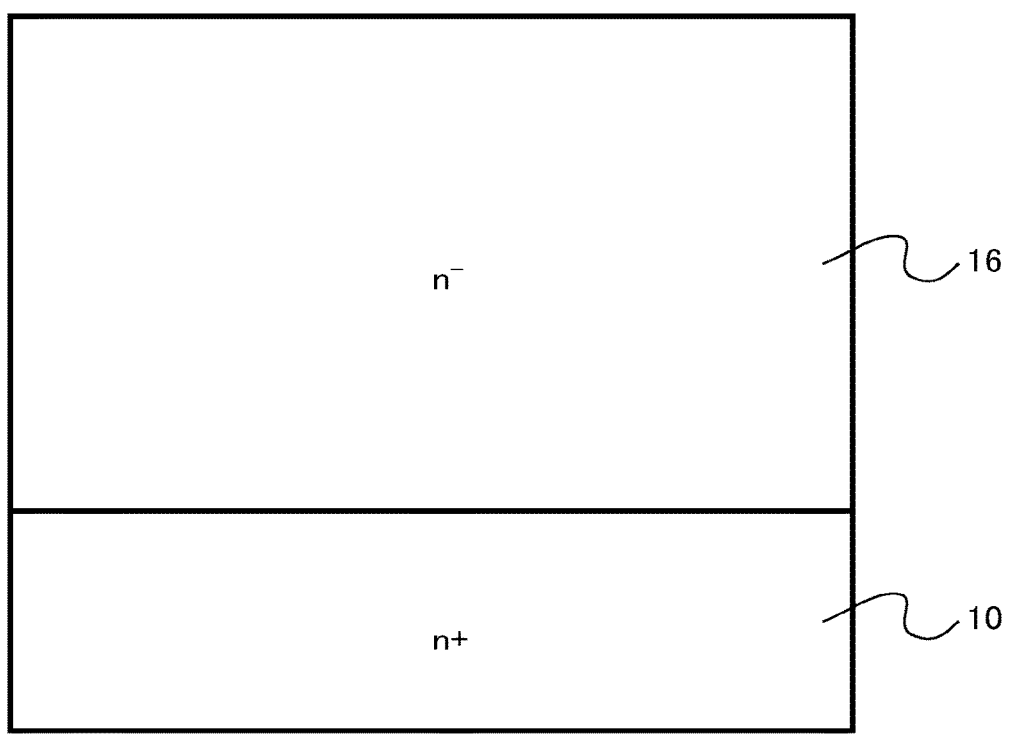
FIG. 4 is a schematic cross-sectional view of the semiconductor device being manufactured by a semiconductor device manufacturing method according to the first embodiment.

The n$^-$-type drift layer 16 is formed on the silicon face of the SiC substrate 10 by an epitaxial growth technique (FIG. 4).

Figure 5:
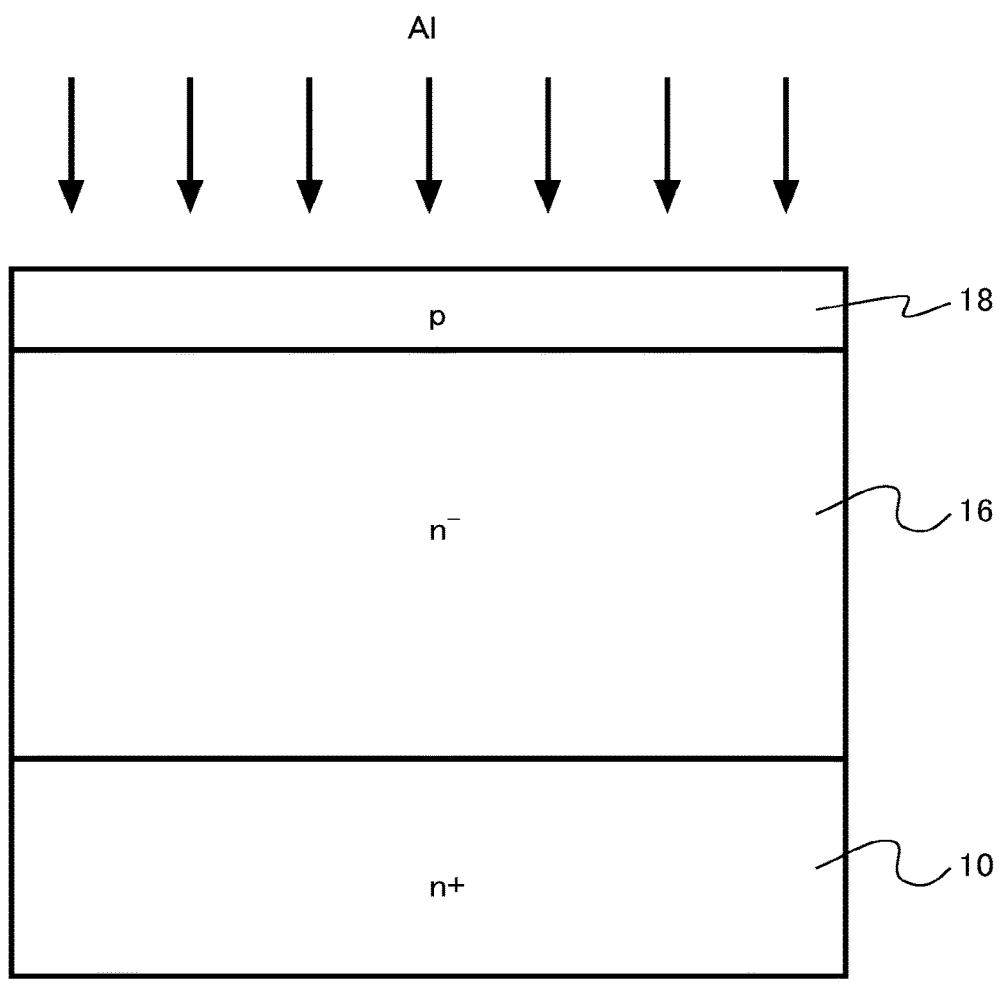
FIG. 5 is a schematic cross-sectional view of the semiconductor device being manufactured by the semiconductor device manufacturing method according to the first embodiment.

The p-type anode region (p-type impurity region) 18 is then formed on the opposite side (one side) of the drift layer 16 from the SiC substrate 10. P-type impurity ions are implanted into the drift layer 16 by a known ion implantation technique, to form the anode region 18 (FIG. 5).

The p-type impurity is Al (aluminum), for example. The dose amount in the ion implantation is not smaller than $1 \times 10^{15}$ cm$^{-2}$ and not larger than $1 \times 10^{17}$ cm$^{-2}$, for example. So as to make the anode region 18 a high-concentration region, the dose amount is preferably $1 \times 10^{16}$ cm$^{-2}$ or larger.

Figure 6:
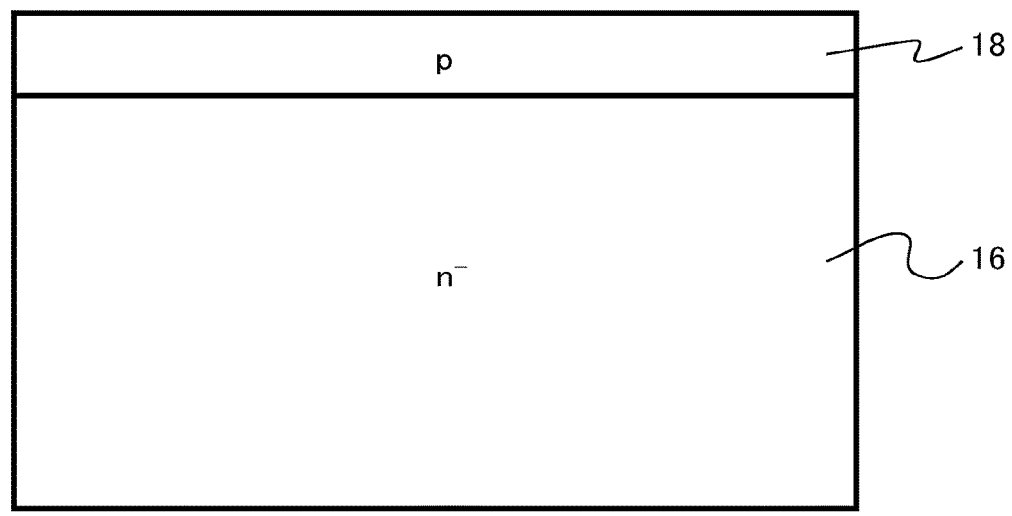
FIG. 6 is a schematic cross-sectional view of the semiconductor device being manufactured by the semiconductor device manufacturing method according to the first embodiment.

At least part of the SiC substrate 10 is then removed, to expose the other side of the drift layer 16 (FIG. 6). Although the entire SiC substrate 10 is removed in this example case, only the peripheral portions of the SiC substrate 10 may be left, or the SiC substrate 10 may be left in a lattice-like fashion, so as to secure the strength of the drift layer 16 after the removal, for example.

The SiC substrate 10 is removed by polishing or grinding, for example. Alternatively, the SiC substrate 10 can be removed by dry etching or wet etching, for example.

Figure 7:
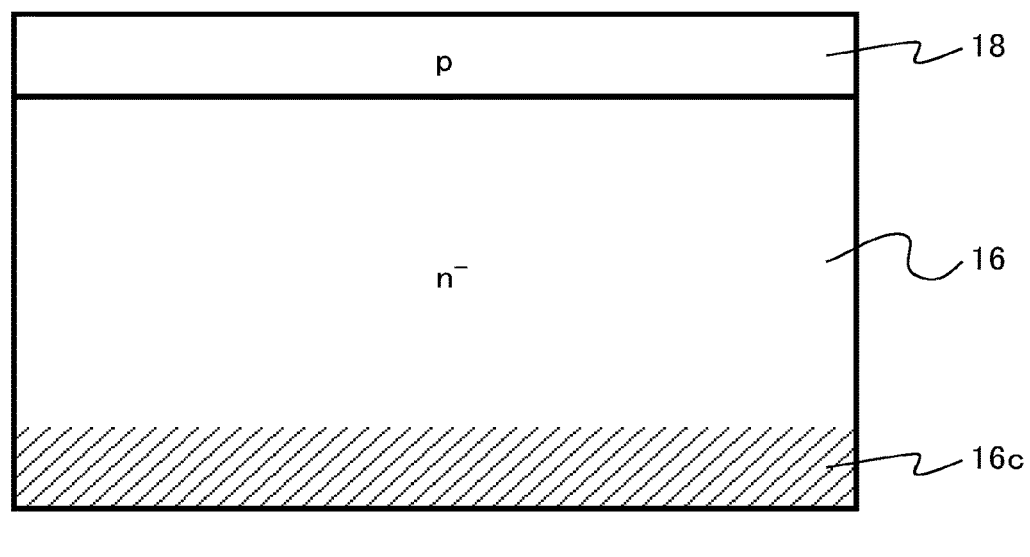
FIG. 7 is a schematic cross-sectional view of the semiconductor device being manufactured by the semiconductor device manufacturing method according to the first embodiment.
Figure 7:
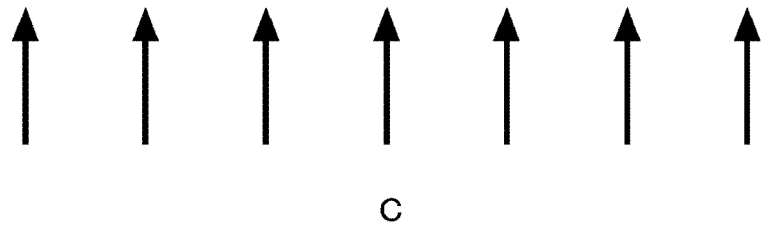

Carbon (C) ions are then implanted into the opposite side (the other side) of the drift layer 16 from the anode region 18. Carbon (C) ions are implanted into the exposed part of the drift layer 16. Through the carbon (C) ion implantation, a high-carbon-concentration region 16c is formed in the drift layer 16 (FIG. 7). In the high-carbon-concentration region 16c, the interstitial carbon concentration is high.

Figure 8:
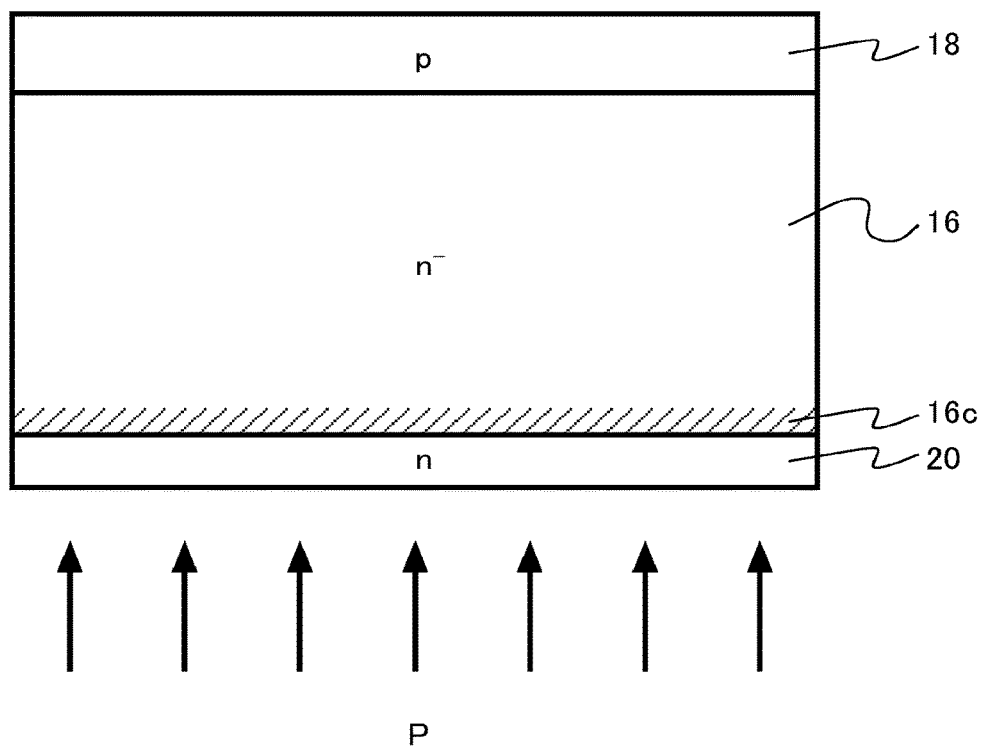
FIG. 8 is a schematic cross-sectional view of the semiconductor device being manufactured by the semiconductor device manufacturing method according to the first embodiment.

The n-type cathode region 20 having a higher n-type impurity concentration than the drift layer 16 is then formed on the opposite side of the drift layer 16 from the anode region 18. N-type impurity ions are implanted into the drift layer 16 by a known ion implantation technique, to form the cathode region 20 (FIG. 8). The impurity ion implantation may be performed prior to the carbon (C) ion implantation.

The n-type impurity is P (phosphorus), for example. Alternatively, the n-type impurity may be N (nitrogen), for example. The dose amount in the ion implantation is not smaller than $1 \times 10^{15}$ cm$^{-2}$ and not larger than $1 \times 10^{17}$ cm$^{-2}$, for example. So as to make the cathode region 20 a high-concentration region, the dose amount is preferably $1 \times 10^{16}$ cm$^{-2}$ or larger.

Figure 9:
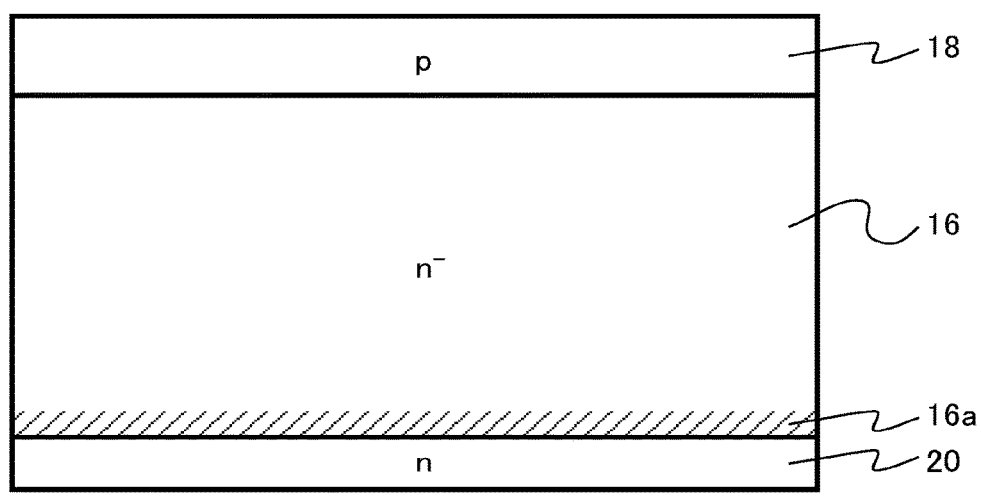
FIG. 9 is a schematic cross-sectional view of the semiconductor device being manufactured by the semiconductor device manufacturing method according to the first embodiment.

After n-type impurity ions are implanted, activation annealing (the heat treatment) is performed to activate the p-type impurity and the n-type impurity. During the activation annealing, the C (carbon) implanted into the high-carbon-concentration region 16c through ion implantation enters carbon vacancies, to form the low-carbon-vacancy-concentration region 16a in a portion of the drift layer 16 located on the side of the cathode electrode (FIG. 9).

So as to reduce carbon vacancies, the activation annealing is preferably performed at 1450° C. or higher, and more preferably, at 1550° C. or higher. The activation annealing is performed in an inert gas atmosphere, for example. If the temperature in the activation annealing is too high, the equilibrium concentration of carbon vacancies becomes higher. Therefore, the activation annealing is preferably performed at 1700° C. or lower, and more preferably, at a lower temperature than 1620° C.

The activation annealing is performed for 30 minutes or longer but not longer than two hours, for example.

Figure 10:
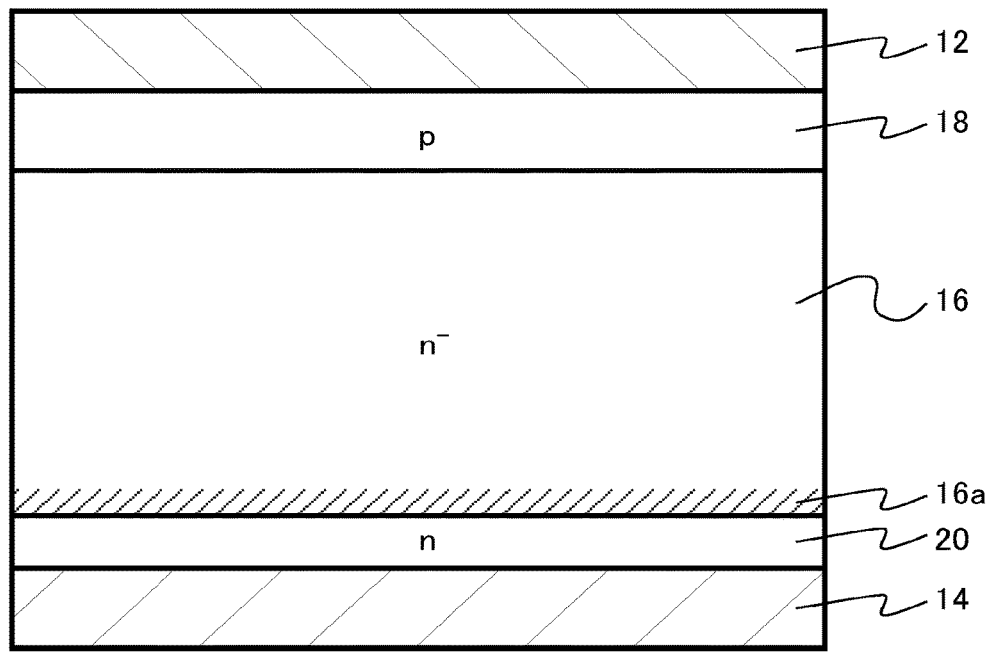
FIG. 10 is a schematic cross-sectional view of the semiconductor device being manufactured by the semiconductor device manufacturing method according to the first embodiment.

The anode electrode 12 is then formed on the anode region 18 through a known process. The cathode electrode 14 is formed on the surface of the cathode region 20 (FIG. 10). By the above described manufacturing method, the PIN diode 100 of this embodiment shown in FIG. 1 is manufactured.

The p-type anode region (p-type impurity region) 18 may be formed after the high-carbon-concentration region 16c or the cathode region 20 is formed.

In the description below, the functions and the effects of the semiconductor device and the semiconductor device manufacturing method according to this embodiment are described.

In a bipolar device like the PIN diode 100, the lifetime of minority carriers becomes shorter due to defects such as carbon vacancies. If the lifetime of minority carriers becomes shorter, the rate of decrease in reverse recovery current (dir/dt) at a time when the PIN diode 100 is turned off becomes higher, resulting in increased noise. This problem is particularly noticeable in a case where the lifetime of minority carriers in the vicinity of the cathode electrode 14 near an edge of a depletion layer is short.

In the PIN diode 100 according to this embodiment, the low-carbon-vacancy-concentration region 16a is formed in a portion of the drift layer 16 located on the side of the cathode electrode 14. As the number of carbon vacancies to be minority carrier killers is small, the lifetime of the minority carriers in the portion of the drift layer 16 located on the side of the cathode electrode 14 becomes longer when the PIN diode 100 is turned off. Accordingly, the rate of decrease in reverse recovery current (dir/dt) becomes lower, and so-called soft recovery characteristics are realized. Thus, generation of noise and ringing at a time when the diode is turned off can be reduced.

In the PIN diode 100 according to this embodiment, the lifetime of the minority carriers in the low-carbon-vacancy-concentration region 16a becomes longer. Accordingly, the conductivity modulation effect at a time when the PIN diode 100 is turned on becomes greater. Thus, the on-state current increases, and the PIN diode 100 with a low on-state voltage is realized.

Specifically, the lifetime of the minority carriers in the low-carbon-vacancy-concentration region 16a is preferably 5 μsec or longer, and more preferably, 10 μsec or longer. Meanwhile, in the low-carbon-vacancy-concentration region 16a, the $Z_{1/2}$ level density measured by DLTS is preferably $1 \times 10^{11}$ cm$^{-3}$ or lower.

The SiC substrate 10 is normally manufactured at a high temperature of 2000° C. or more by a sublimation technique or the like. The higher the SiC manufacturing temperature is, the higher the carbon vacancy concentration in the SiC becomes. Therefore, the SiC substrate 10 normally has a high carbon vacancy concentration.

By the method of manufacturing the PIN diode 100 according to this embodiment, the SiC substrate 10 used when the drift layer 16 is epitaxially grown is removed. Accordingly, the carbon vacancies in the SiC substrate 10 can be prevented from diffusing into the drift layer 16 due to the heat treatment during the manufacturing of the PIN diode 100. Thus, the carbon vacancy concentration in the portion of the drift layer 16 located on the side of the cathode electrode 14 can be easily lowered.

Furthermore, by the method of manufacturing the PIN diode 100 according to this embodiment, C (carbon) ions are implanted into the drift layer 16 after the SiC substrate 10 is removed. The implanted carbon turns into interstitial carbon, and fills carbon vacancies in the heat treatment that follows. As carbon vacancies are filled, the carbon vacancy concentration in the portion of the drift layer 16 located on the side of the cathode electrode 14 can be further lowered.

Also, by the method of manufacturing the PIN diode 100 according to this embodiment, C (carbon) is introduced from the side of the cathode region 20. Therefore, the carbon vacancy concentration in the portion of the drift layer 16 located on the side of the cathode region 20 can be more easily lowered than in a case where C (carbon) is introduced from the side of the anode region 18, for example. Accordingly, lower production costs can be realized through a reduction in the manufacturing time of the PIN diode 100.

By the manufacturing method according to this embodiment, the activation of the p-type impurity and the n-type impurity, and the heat treatment for filling carbon vacancies are conducted at the same time in the above described example case. However, a second heat treatment for filling carbon vacancies may be performed after a first heat treatment for activating the p-type impurity or the n-type impurity is performed. In this case, the temperature in the second heat treatment is preferably lower than the temperature in the first heat treatment, so as to sufficiently activate the p-type impurity or the n-type impurity and sufficiently lower the carbon vacancy concentration.

Through the above described functions, the PIN diode 100 according to this embodiment lowers the rate of decrease in reverse recovery current, and realizes soft recovery characteristics. Also, the lifetime of carriers becomes longer, and the on-state resistance becomes lower.

Further, by the manufacturing method according to this embodiment, the PIN diode 100 that has soft recovery characteristics and a low on-state resistance can be realized at low costs.

Second Embodiment

A semiconductor device manufacturing method according to this embodiment includes: forming an n-type SiC layer on a SiC substrate; forming a p-type impurity region at one side of the SiC layer; exposing other side of the SiC layer by removing at least part of the SiC substrate; forming a thermally-oxidized film at the exposed part of the SiC layer; removing the thermally-oxidized film; forming a first electrode on the p-type impurity region; and forming a second electrode on the exposed part of the SiC layer.

The semiconductor device manufacturing method according to this embodiment is another example of a method of manufacturing the semiconductor device of the first embodiment shown in FIG. 1. The manufacturing method according to this embodiment differs from the manufacturing method according to the first embodiment, in that the low-carbon-vacancy-concentration region 16a is formed not through ion implantation but through SiC oxidation. The same explanations as those in the first embodiment will not be repeated.

Figure 11:
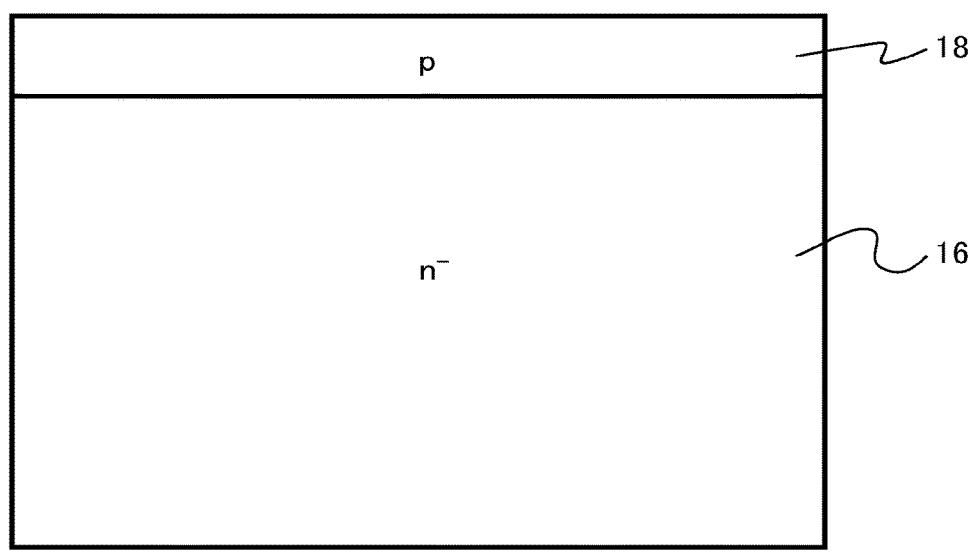
FIG. 11 is a schematic cross-sectional view of the semiconductor device being manufactured by a semiconductor device manufacturing method according to a second embodiment.

FIGS. 11 through 14 are schematic cross-sectional views showing the semiconductor device being manufactured by the semiconductor device manufacturing method according to this embodiment. The removal of the SiC substrate 10 and the procedures before that are the same as those by the manufacturing method according to the first embodiment (FIG. 11).

Figure 12:
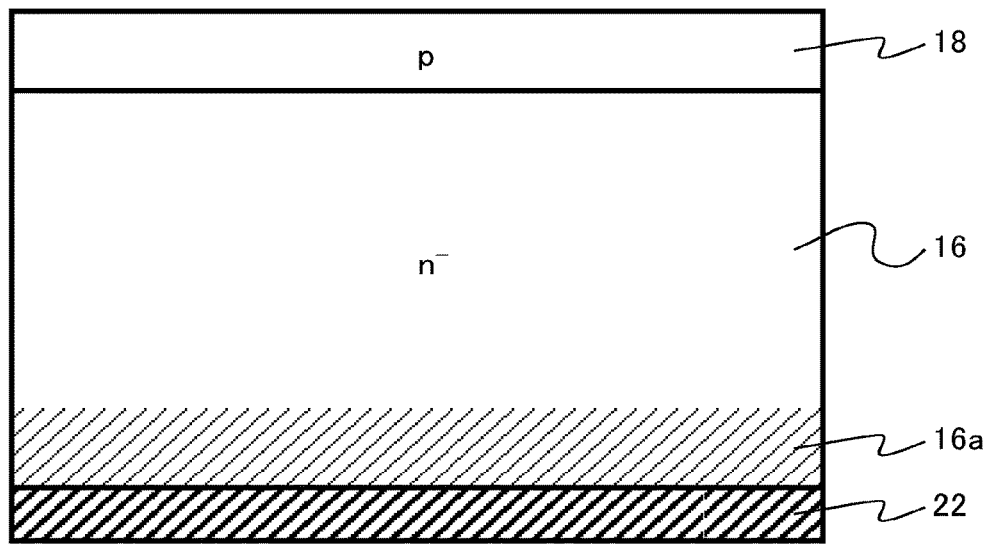
FIG. 12 is a schematic cross-sectional view of the semiconductor device being manufactured by the semiconductor device manufacturing method according to the second embodiment.

A thermally-oxidized film 22 is then formed on the opposite side (the other side) of the n-type drift layer (n-type SiC layer) 16 from the anode region (p-type impurity region) 18 (FIG. 12). A thermally-oxidized film 22 is formed at exposed part of the n-type drift layer (n-type SiC layer) 16. As the interstitial carbon generated at the time of the formation of the thermally-oxidized film 22 fills carbon vacancies, the low-carbon-vacancy-concentration region 16a is formed on the opposite side of the drift layer 16 from the anode region 18.

The thermal oxidation for forming the thermally-oxidized film 22 is performed in an oxidizing atmosphere at a temperature not lower than 800° C. and not higher than 1500° C., for example. So as to sufficiently lower the carbon vacancy concentration, the temperature is preferably not lower than 900° C. and not higher than 1350° C. More preferably, the temperature is not lower than 1150° C. and not higher than 1300° C.

Figure 13:
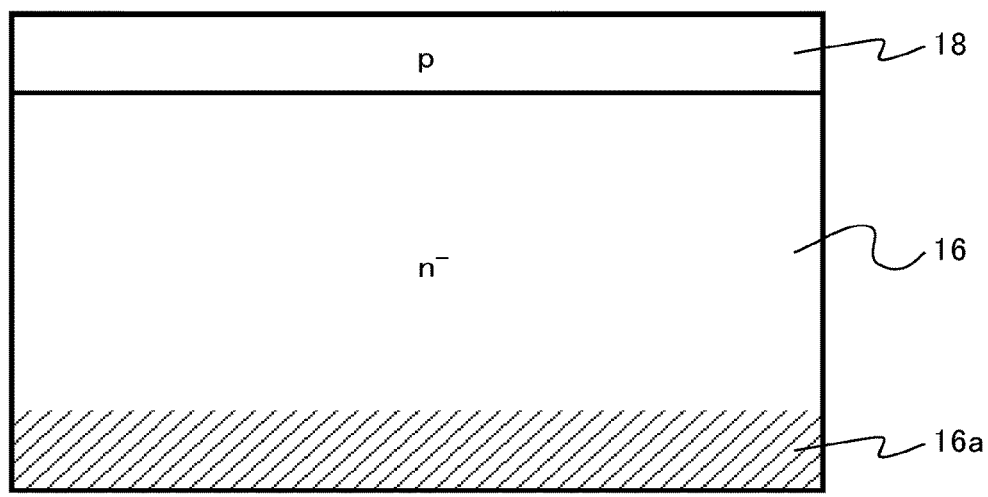
FIG. 13 is a schematic cross-sectional view of the semiconductor device being manufactured by the semiconductor device manufacturing method according to the second embodiment.

The thermally-oxidized film 22 is then removed (FIG. 13). For example, the thermally-oxidized film 22 is removed by hydrofluoric-acid wet etching.

Figure 14:
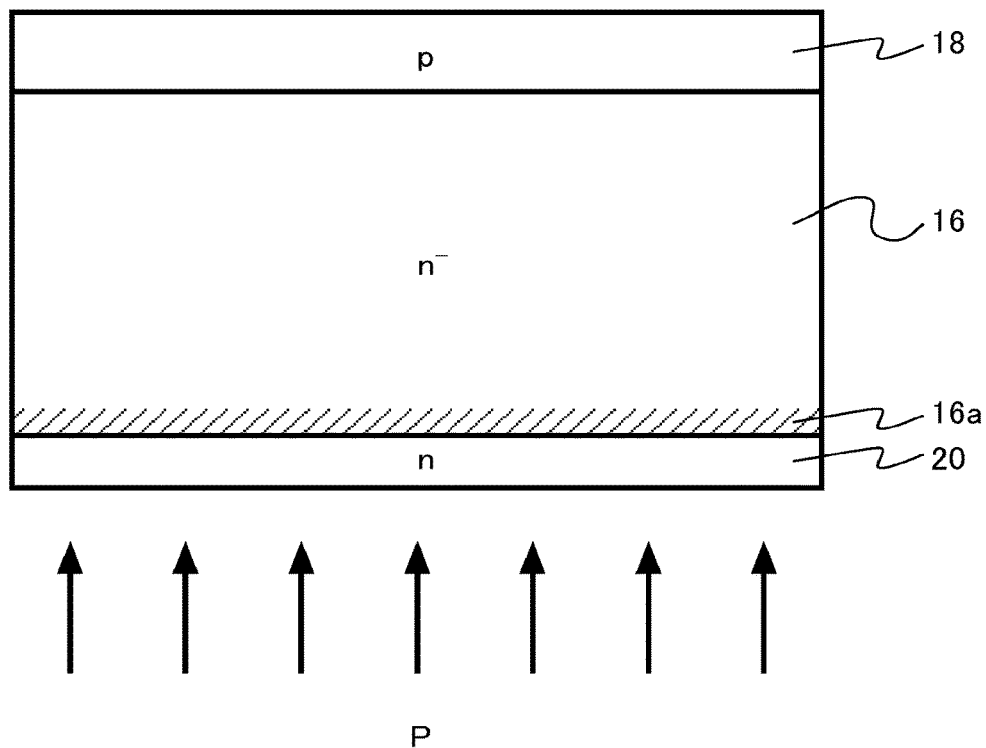
FIG. 14 is a schematic cross-sectional view of the semiconductor device being manufactured by the semiconductor device manufacturing method according to the second embodiment.

The n-type cathode region 20 having a higher n-type impurity concentration than the drift layer 16 is then formed on the opposite side (the other side) of the drift layer 16 from the anode region 18. N-type impurity ions are implanted into the drift layer 16 by a known ion implantation technique, to form the cathode region 20 (FIG. 14).

The n-type impurity is P (phosphorus), for example. Alternatively, the n-type impurity may be N (nitrogen), for example. The dose amount in the ion implantation is not smaller than $1 \times 10^{15}$ cm$^{-2}$ and not larger than $1 \times 10^{17}$ cm$^{-2}$, for example. So as to make the cathode region 20 a high-concentration region, the dose amount is preferably $1 \times 10^{16}$ cm$^{-2}$ or larger.

After n-type impurity ions are implanted, activation annealing (the heat treatment) is performed to activate the p-type impurity and the n-type impurity.

The activation annealing is performed in an inert gas atmosphere, for example. If the temperature in the activation annealing is too high, the equilibrium concentration of carbon vacancies becomes higher. Therefore, the activation annealing is preferably performed at 1700° C. or lower, and more preferably, at a lower temperature than 1620° C.

The anode electrode 12 is then formed on the anode region 18 through a known process. The cathode electrode 14 is formed on the surface of the cathode region 20, so that the PIN diode 100 of this embodiment shown in FIG. 1 is completed.

By the manufacturing method according to this embodiment, the PIN diode 100 that has soft recovery characteristics and a low on-state resistance can be realized.

The p-type anode region (p-type impurity region) 18 may be formed after the thermally-oxidized film 22 is formed.

In this embodiment, the thermally-oxidized film 22 is formed on the carbon face side of the drift layer 16. In the carbon face, the oxidation rate is 10 times as high as that in the silicon face. Accordingly, an oxide film having the same thickness as that in the silicon face can be formed in a shorter time or at a lower temperature than that in the silicon face. Thus, the low-carbon-vacancy-concentration region 16a can be readily formed. Accordingly, lower production costs can be realized through a reduction in the manufacturing time of the PIN diode 100.

Although the n-type impurity ion implantation for forming the cathode region 20 is conducted after the removal of the thermally-oxidized film 22 in the above described example case, the n-type impurity ion implantation may be conducted prior to the formation of the thermally-oxidized film 22. As the thermally-oxidized film 22 is formed after the n-type impurity ion implantation, the n-type impurity piles up in the interface between the thermally-oxidized film 22 and the SiC, so that the thin cathode region 20 with a high concentration can be formed.

In a case where the n-type impurity ion implantation is conducted prior to the formation of the thermally-oxidized film 22, the thermally-oxidized film 22 is preferably formed by performing thermal oxidation to a greater depth than the projected range (Rp) of the n-type impurity ion implantation, so as to form the thin cathode region 20 having a high concentration.

Although the p-type impurity ion implantation for forming the anode region 18 is conducted prior to the formation of the thermally-oxidized film 22 in the above described example case, the p-type impurity ion implantation may be conducted after the formation of the thermally-oxidized film 22.

Although the thermally-oxidized film 22 is formed only on the opposite side of the drift layer 16 from the anode region (p-type impurity region) 18 in the above described example case of this embodiment, another thermally-oxidized film may also be formed on the side of the anode region 18 at the same time. As another thermally-oxidized film is formed on the side of the anode region 18 to be a silicon face, the carbon vacancy concentration in the portion of the drift layer 16 on the side of the anode region 18 becomes lower, and further, the on-state resistance can be lowered.

Third Embodiment

A semiconductor device manufacturing method according to this embodiment is the same as the method according to the first embodiment, except that a thermally-oxidized film is formed on the opposite side of the SiC layer from the p-type impurity region (at the exposed part of the SiC layer) after the heat treatment. Therefore, the same explanations as those in the first embodiment will not be repeated.

The semiconductor device manufacturing method according to this embodiment is yet another example of a method of manufacturing the semiconductor device of the first embodiment shown in FIG. 1. The low-carbon-vacancy-concentration region 16a is formed through both ion implantation and SiC oxidation.

Figure 15:
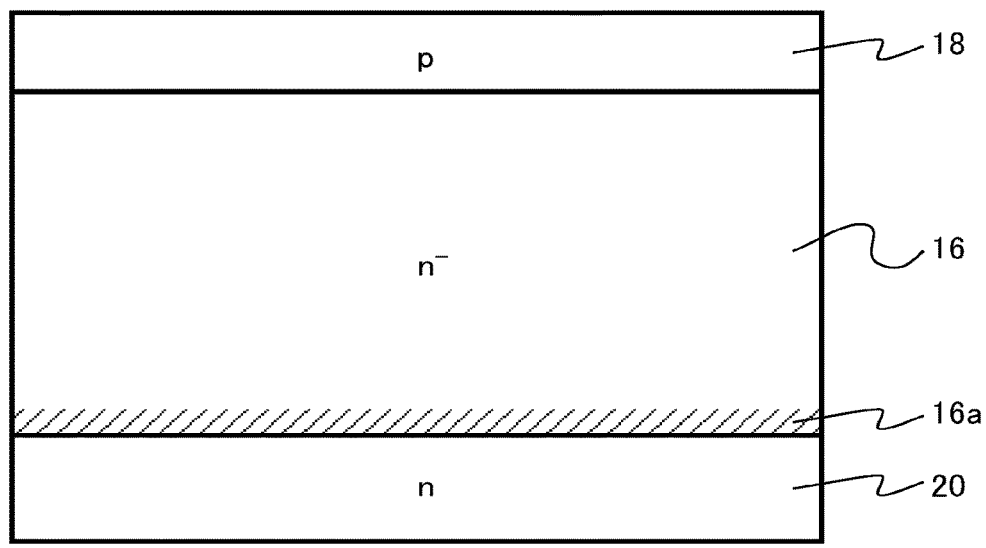
FIG. 15 is a schematic cross-sectional view of the semiconductor device being manufactured by a semiconductor device manufacturing method according to a third embodiment.
Figure 16:
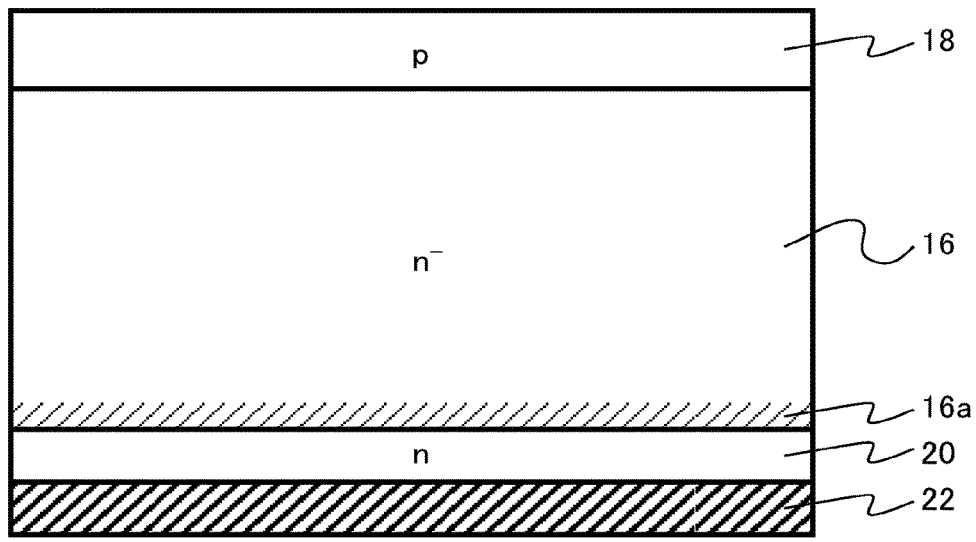
FIG. 16 is a schematic cross-sectional view of the semiconductor device being manufactured by the semiconductor device manufacturing method according to the third embodiment.
Figure 17:
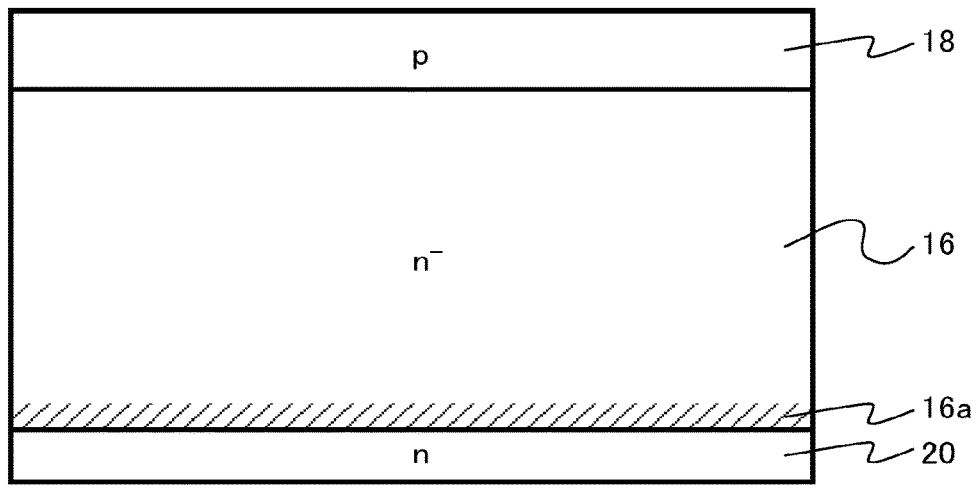
FIG. 17 is a schematic cross-sectional view of the semiconductor device being manufactured by the semiconductor device manufacturing method according to the third embodiment.

FIGS. 15 through 17 are schematic cross-sectional views showing the semiconductor device being manufactured by the semiconductor device manufacturing method according to this embodiment. The procedures until n-type impurity ions are implanted into the drift layer 16 and activation annealing (the heat treatment) is performed after C (carbon) ions are implanted into the opposite side (the other side) of the drift layer (n-type SiC layer) 16 from the anode region (p-type impurity region) 18 are the same as those of the first embodiment. The low-carbon-vacancy-concentration region 16a is formed with the carbon implanted through the ion implantation (FIG. 15).

A thermally-oxidized film 22 is formed on the opposite side of the n-type drift layer 16 from the anode region 18 (FIG. 16). As the interstitial carbon generated at the time of the formation of the thermally-oxidized film 22 fills carbon vacancies, the carbon vacancy concentration in the low-carbon-vacancy-concentration region 16a becomes even lower.

The n-type impurity piles up in the interface between the thermally-oxidized film 22 and the SiC, so that the thin cathode region 20 with a high concentration can be formed.

The thermally-oxidized film 22 is then removed (FIG. 17). For example, the thermally-oxidized film 22 is removed by hydrofluoric-acid wet etching.

The anode electrode 12 is then formed on the anode region 18 through a known process. The cathode electrode 14 is formed on the surface of the cathode region 20, so that the PIN diode 100 of this embodiment shown in FIG. 1 is completed.

By the manufacturing method according to this embodiment, the PIN diode 100 that has soft recovery characteristics and a low on-state resistance can be realized. Particularly, as the low-carbon-vacancy-concentration region 16a is formed through both ion implantation and SiC oxidation, a PIN diode 100 that has even better soft recovery characteristics and a lower on-state resistance than those of the first and second embodiments is realized.

Fourth Embodiment

A semiconductor device according to this embodiment includes: a first electrode; a second electrode; an n-type SiC layer provided between the first electrode and the second electrode, the SiC layer having a profile indicating that the carbon vacancy concentration increases, decreases, increases, and decreases in the direction from the first electrode toward the second electrode; and a p-type impurity region provided between the first electrode and the SiC layer.

Figure 18:
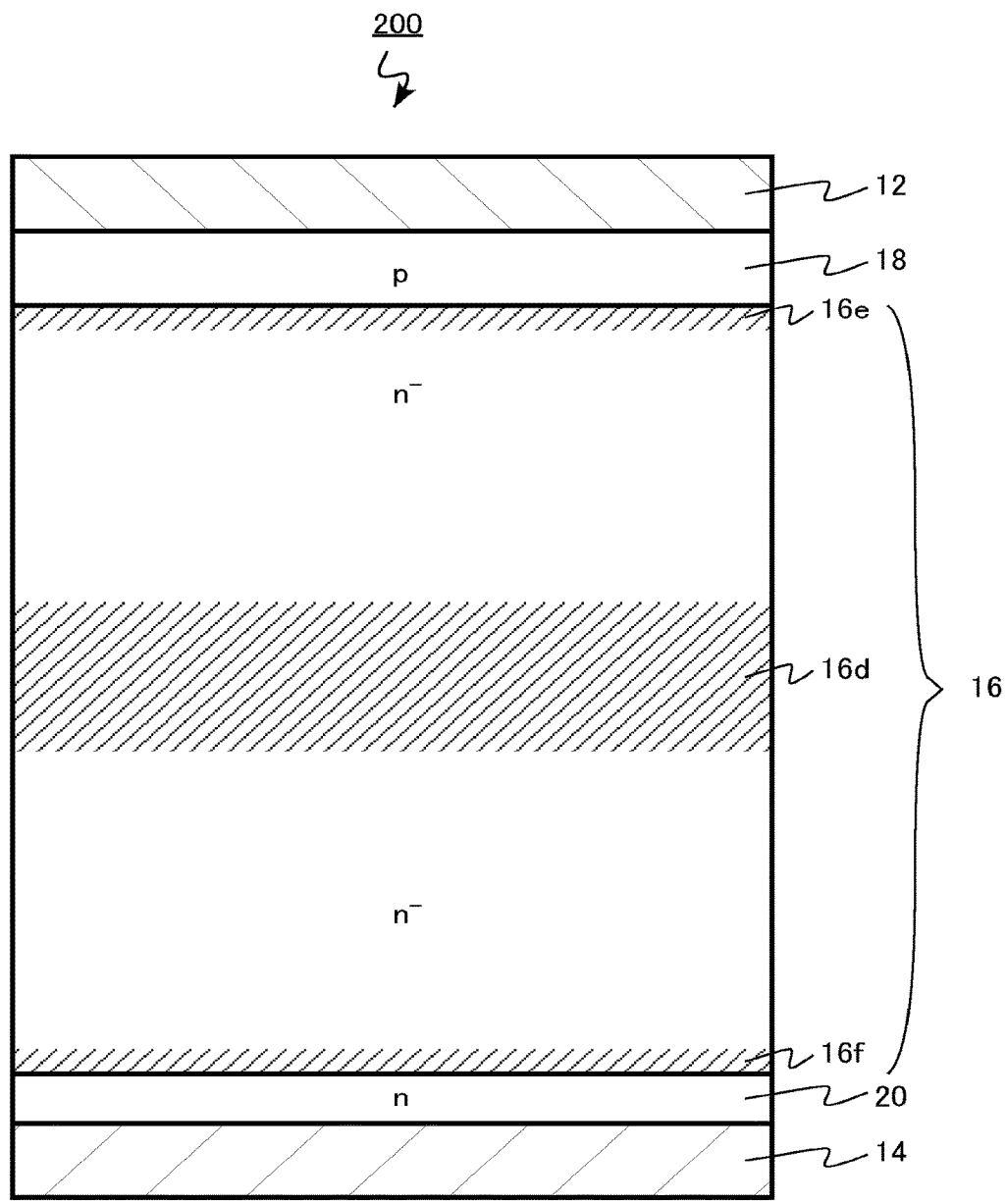
FIG. 18 is a schematic cross-sectional view of a semiconductor device according to a fourth embodiment.

FIG. 18 is a schematic cross-sectional view showing the structure of a PIN diode that is a semiconductor device according to this embodiment.

This PIN diode 200 includes an anode electrode (the first electrode) 12, a cathode electrode (the second electrode) 14, an n$^-$-type drift layer (the n-type SiC layer) 16, a first low-carbon-vacancy-concentration region (a first region) 16d, a second low-carbon-vacancy-concentration region (a second region) 16e, a third low-carbon-vacancy-concentration region (a third region) 16f, a p-type anode region (the p-type impurity region) 18, and an n-type cathode region (an n-type impurity region) 20.

The n$^-$-type drift layer 16 is provided between the anode electrode 12 and the cathode electrode 14. The drift layer 16 is a SiC epitaxially grown layer formed on a SiC substrate (not shown) by epitaxial growth, for example.

The concentration of the n-type impurity in the drift layer 16 is not lower than $5 \times 10^{14}$ cm$^{-3}$ and not higher than $5 \times 10^{15}$ cm$^{-3}$, for example. The n-type impurity is N (nitrogen), for example. The thickness of the drift layer 16 is not smaller than 50 μm and not greater than 150 μm, for example.

The surface of the drift layer 16 is a plane tilted zero to eight degrees with respect to the silicon face, for example. A plane tilted zero to eight degrees with respect to the silicon face can be regarded as substantially equivalent to the silicon face in terms of characteristics.

The drift layer 16 has the low-carbon-vacancy-concentration region 16d in the middle portion thereof. The drift layer 16 has the low-carbon-vacancy-concentration region 16e on the side of the anode electrode 12. The drift layer 16 has the low-carbon-vacancy-concentration region 16f on the side of the cathode electrode 14.

The p-type anode region 18 is provided between the anode electrode 12 and the drift layer 16. The anode region 18 is provided on the surface of the drift layer 16.

The concentration of the p-type impurity in the anode region 18 is not lower than $1 \times 10^{18}$ cm$^{-3}$ and not higher than $1 \times 10^{20}$ cm$^{-3}$, for example. The p-type impurity in the anode region 18 is Al (aluminum), for example. Alternatively, the p-type impurity may be B (boron), Ga (gallium), or In (indium).

The depth of the anode region 18 is approximately 0.3 μm, for example. The surface of the anode region 18 is also a plane tilted zero to eight degrees with respect to the silicon face, for example.

The anode electrode 12 is made of a metal, for example. The metal forming the anode electrode 12 is TiN (titanium nitride), for example. Another metal such as Al (aluminum) may be stacked on the TiN. Other than a metal, it is possible to employ an electrically-conductive material such as polycrystalline silicon containing an n-type impurity.

The anode region 18 and the anode electrode 12 are electrically connected.

The n-type cathode region 20 is provided between the drift layer 16 and the cathode electrode 14. The cathode region 20 has the function to lower the contact resistance of the cathode electrode 14.

The n-type impurity concentration in the cathode region 20 is higher than the n-type impurity concentration in the drift layer 16. The concentration of the n-type impurity in the cathode region 20 is not lower than $1 \times 10^{18}$ cm$^{-3}$ and not higher than $1 \times 10^{20}$ cm$^{-3}$, for example. The n-type impurity is P (phosphorus), for example. Alternatively, the n-type impurity may be N (nitrogen), for example. The thickness of the cathode region 20 is not smaller than 0.1 μm and not greater than 1 μm, for example.

The surface on the side of the cathode electrode 14 is a plane tilted zero to eight degrees with respect to the carbon face. A plane tilted zero to eight degrees with respect to the carbon face can be regarded as substantially equivalent to the carbon face in terms of characteristics.

The cathode electrode 14 is formed with stacked layers that are a Ni (nickel) barrier metal layer and an Al (aluminum) metal layer formed on the barrier metal layer, for example. The Ni barrier metal layer and the Al metal layer may form an alloy through a reaction. Alternatively, the Ni and the cathode region 20 may form a silicide through a reaction.

The cathode region 20 and the cathode electrode 14 are electrically connected.

Figure 19:
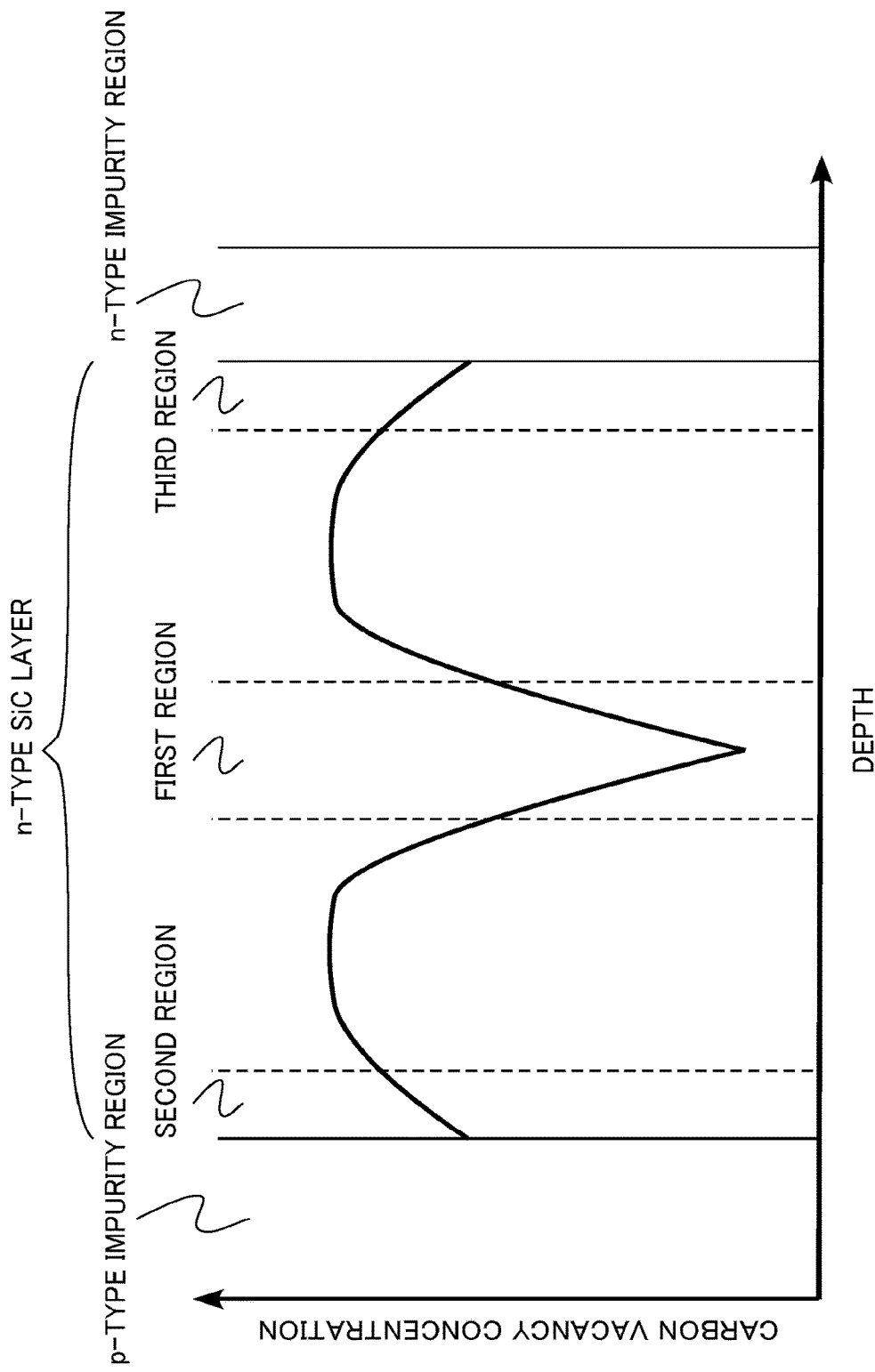
FIG. 19 is a diagram showing the profile of the concentration of carbon vacancies in the semiconductor device according to the fourth embodiment.

FIG. 19 is a diagram showing the profile of the concentration of carbon vacancies in the semiconductor device according to this embodiment. This diagram shows the profile of the concentration of carbon vacancies in a cross-section including the p-type anode region (p-type impurity region) 18 and the n-type cathode region (n-type impurity region) 20. The concentration of carbon vacancies can be measured by DLTS (Deep Level Transient Spectroscopy). Specifically, the $Z_{1/2}$ concentration measured by DLTS is regarded as the concentration of carbon vacancies, for example.

As shown in FIG. 19, the n-type drift layer (n-type SiC layer) 16 has a profile indicating that the carbon vacancy concentration increases, decreases, increases, and then decreases in the direction from the anode electrode (first electrode) 12 toward the cathode electrode (second electrode) 14.

Next, a semiconductor device manufacturing method according to this embodiment is described. The semiconductor device manufacturing method according to this embodiment is an example of a method of manufacturing the semiconductor device shown in FIG. 18.

FIGS. 20 through 25 are schematic cross-sectional views showing the semiconductor device being manufactured by the semiconductor device manufacturing method according to this embodiment.

First, an n$^+$-type SiC substrate 10 is prepared. The SiC substrate 10 is the SiC of 4H—SiC containing N (nitrogen), for example, as the n-type impurity at an impurity concentration not lower than $1\times10^{18}$ cm$^{-3}$ and not higher than $1\times10^{20}$ cm$^{-3}$, for example. The SiC substrate 10 is a substrate formed by a sublimation technique, for example. The thickness of the SiC substrate 10 is not smaller than 300 µm and not greater than 500 µm, for example.

One of the planes of the SiC substrate 10 is a silicon face, for example. The other one of the planes of the SiC substrate 10 is a carbon face, for example.

Figure 20:
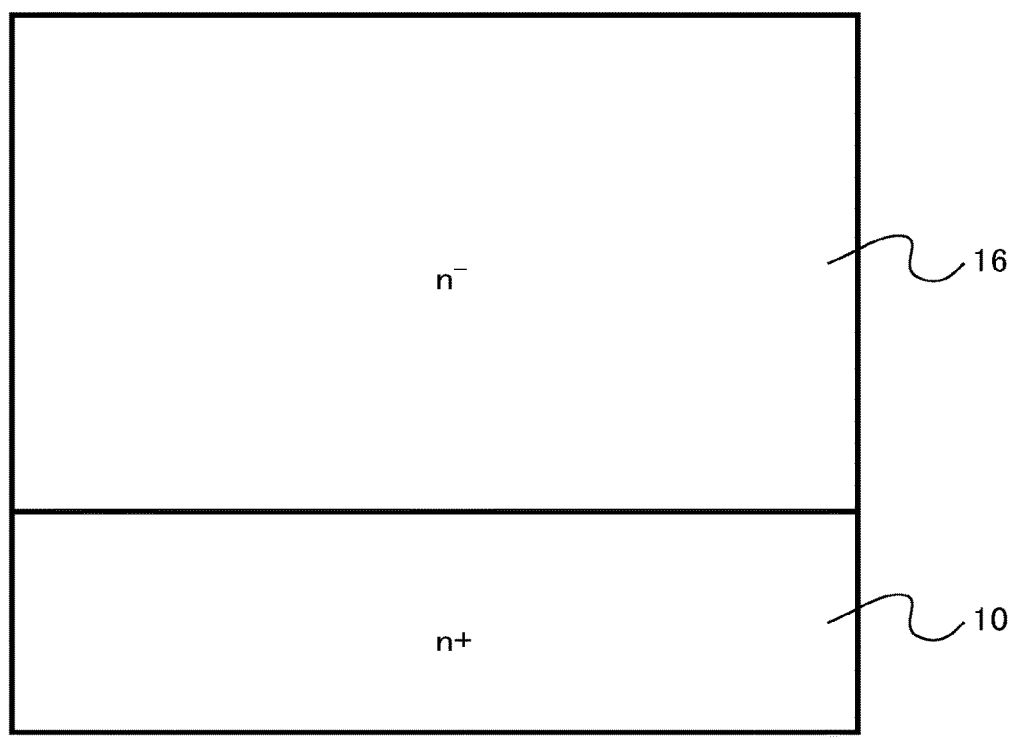
FIG. 20 is a schematic cross-sectional view of the semiconductor device being manufactured by a semiconductor device manufacturing method according to the fourth embodiment.

The n$^-$-type drift layer 16 is formed on the silicon face of the SiC substrate 10 by an epitaxial growth technique (FIG. 20).

Figure 21:
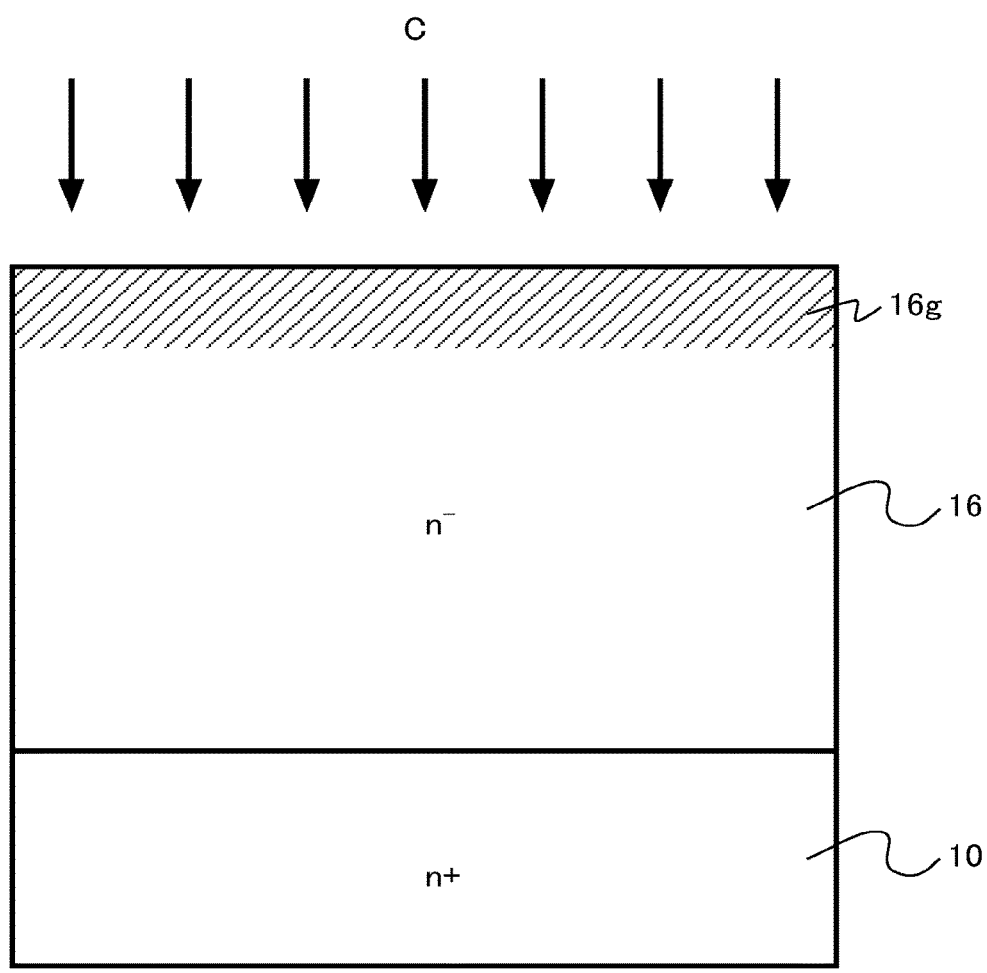
FIG. 21 is a schematic cross-sectional view of the semiconductor device being manufactured by the semiconductor device manufacturing method according to the fourth embodiment.

Carbon (C) ions are then implanted into the silicon face side of the drift layer 16 (FIG. 21). Through the carbon (C) ion implantation, a high-carbon-concentration region 16g is formed in the drift layer 16.

Figure 22:
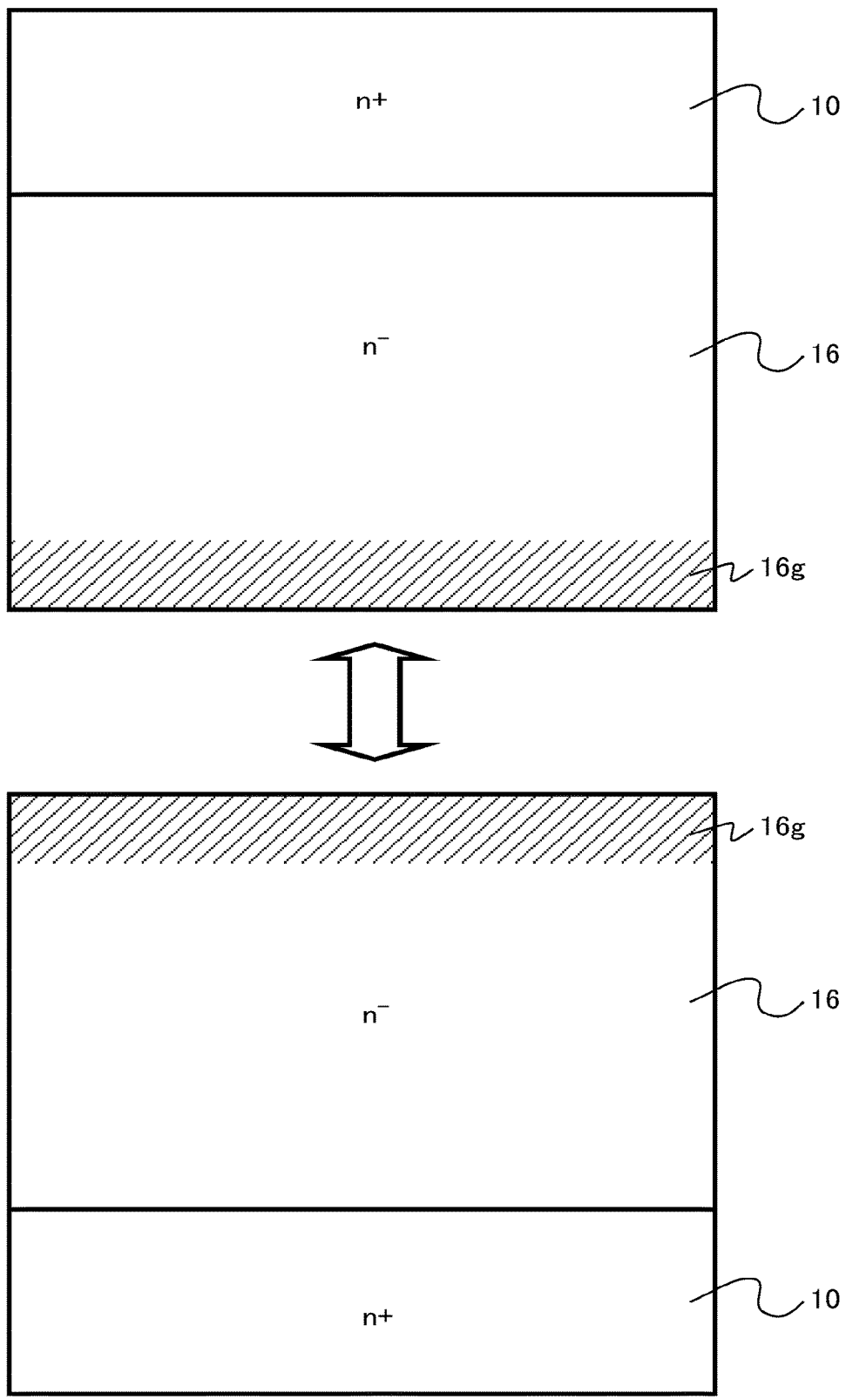
FIG. 22 is a schematic cross-sectional view of the semiconductor device being manufactured by the semiconductor device manufacturing method according to the fourth embodiment.

The drift layers 16 on two substrates manufactured by the above method are then bonded to each other (FIG. 22). In this case, the silicon faces of the two substrates are bonded to each other.

Both surfaces of the bonded substrates are polished, and at least part of each SiC substrate 10 is removed, so that the drift layer 16 is exposed. Although the entire SiC substrates 10 are removed in this example case, only the peripheral portions of the SiC substrates 10 may be left, or the SiC substrates 10 may be left in a lattice-like fashion, so as to secure strength after the removal, for example.

Figure 23:
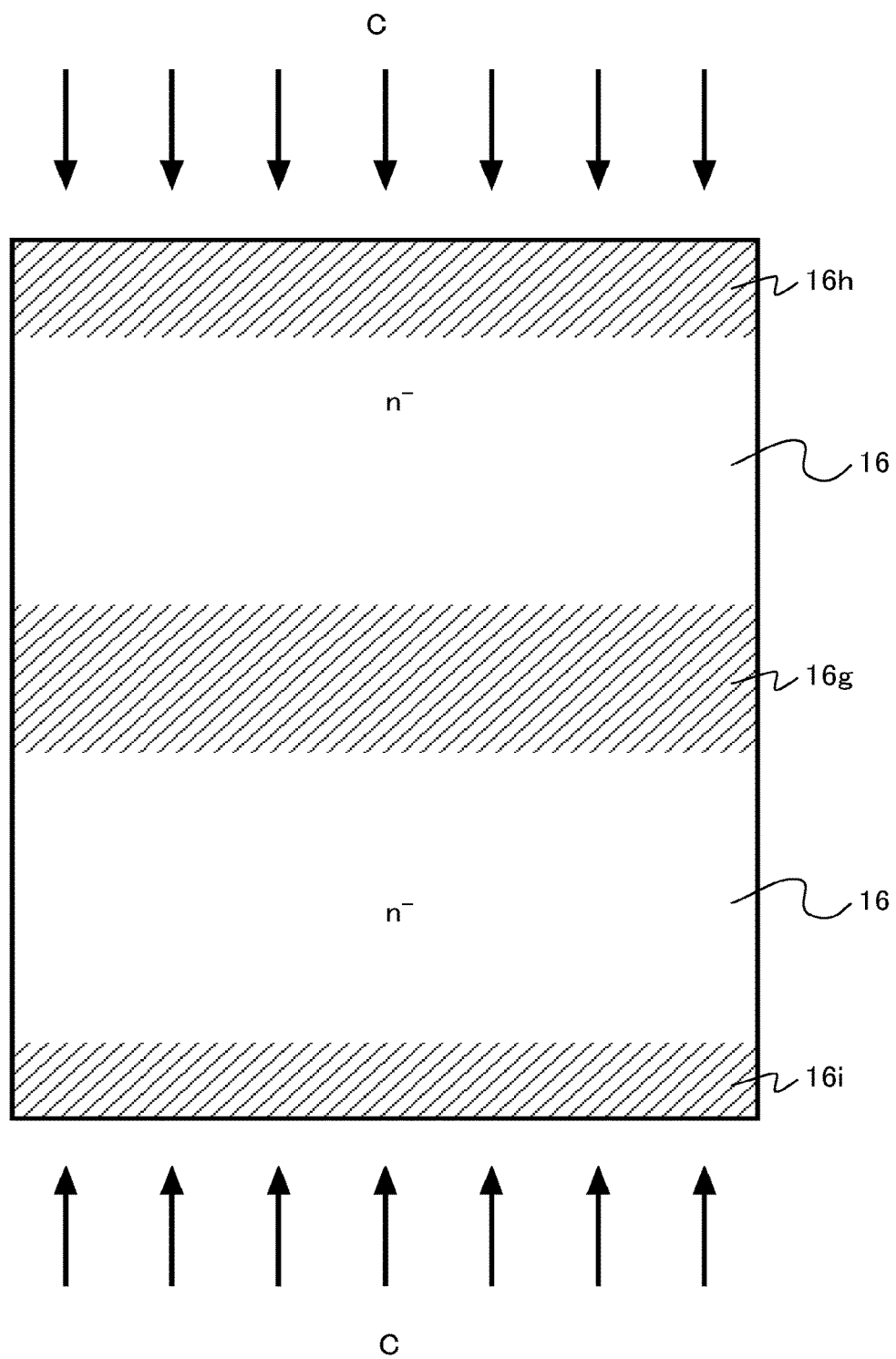
FIG. 23 is a schematic cross-sectional view of the semiconductor device being manufactured by the semiconductor device manufacturing method according to the fourth embodiment.

Carbon (C) ions are then implanted into both of the exposed surfaces of the drift layer 16 (FIG. 23). Through the carbon (C) ion implantation, high-carbon-concentration regions 16h and 16i are formed in the drift layer 16.

Figure 24:
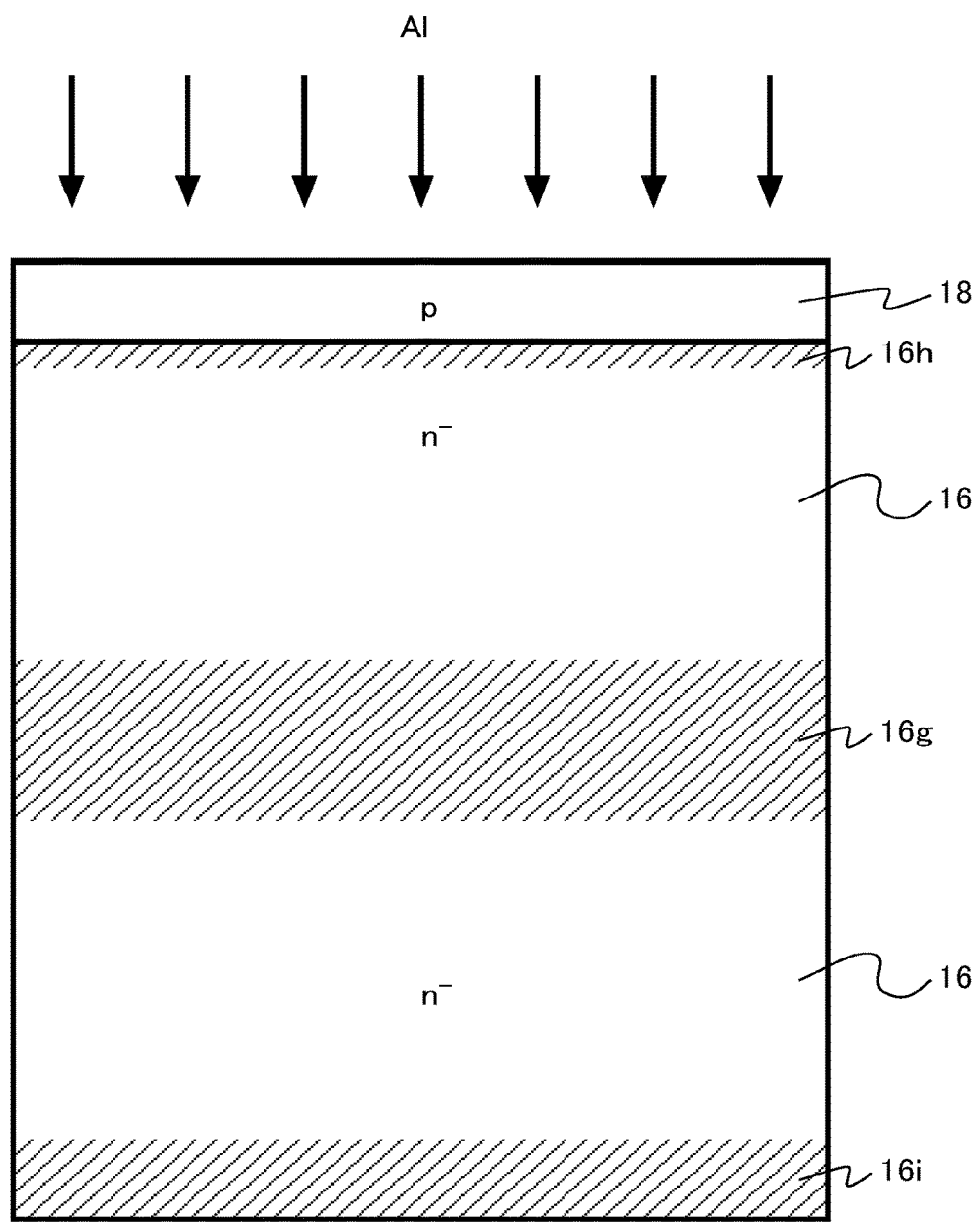
FIG. 24 is a schematic cross-sectional view of the semiconductor device being manufactured by the semiconductor device manufacturing method according to the fourth embodiment.

The p-type anode region (p-type impurity region) 18 is then formed on one of the surfaces of the drift layer 16. P-type impurity ions are implanted into the drift layer 16 by a known ion implantation technique, to form the anode region 18 (FIG. 24).

The p-type impurity is Al (aluminum), for example. The dose amount in the ion implantation is not smaller than $1\times10^{15}$ cm$^{-2}$ and not larger than $1\times10^{17}$ cm$^{-2}$, for example. So as to make the anode region 18 a high-concentration region, the dose amount is preferably $1\times10^{16}$ cm$^{-2}$ or larger.

Figure 25:
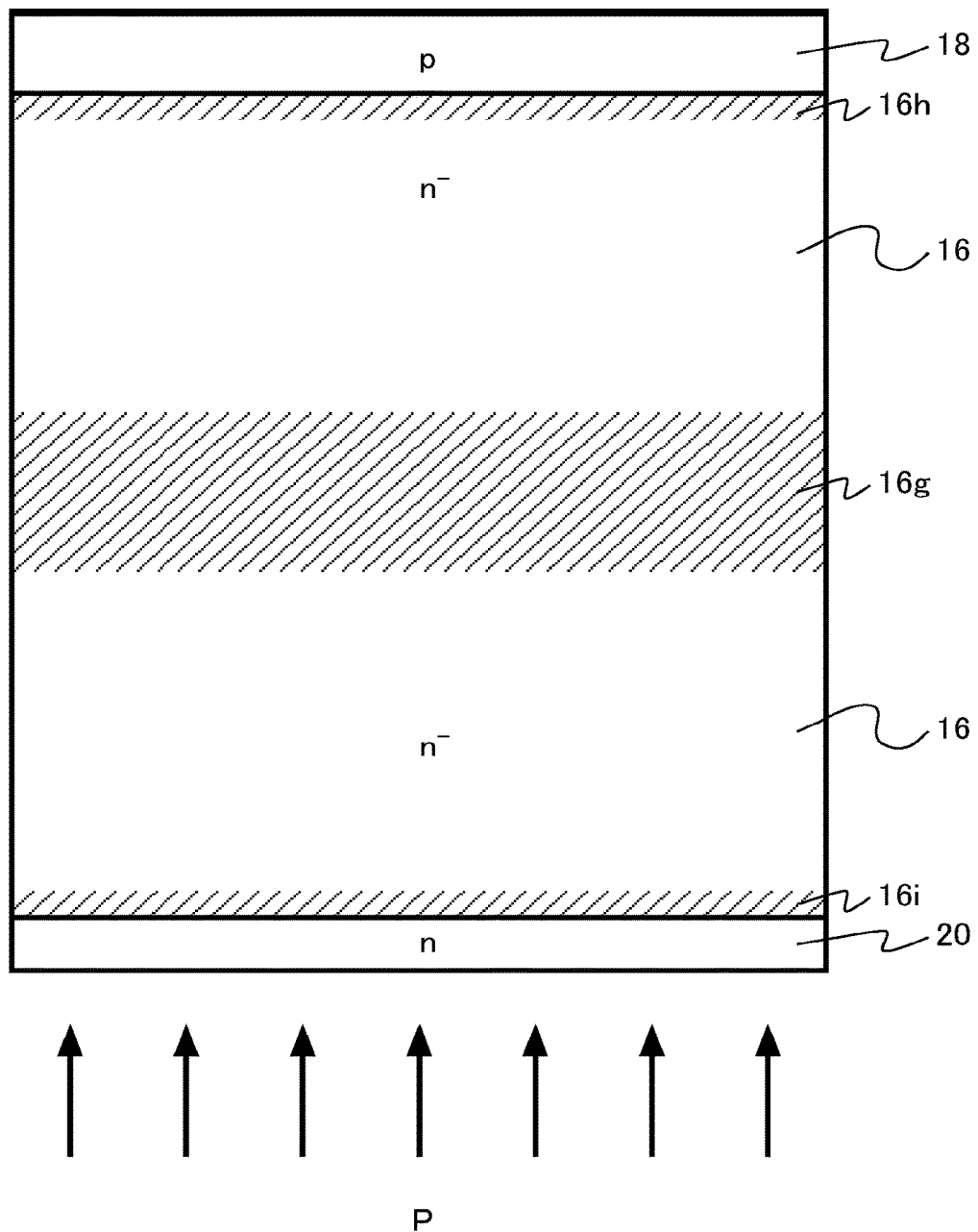
FIG. 25 is a schematic cross-sectional view of the semiconductor device being manufactured by the semiconductor device manufacturing method according to the fourth embodiment.

The n-type cathode region 20 having a higher n-type impurity concentration than the drift layer 16 is then formed on the opposite side of the drift layer 16 from the anode region 18. N-type impurity ions are implanted into the drift layer 16 by a known ion implantation technique, to form the cathode region 20 (FIG. 25).

The n-type impurity is P (phosphorus), for example. Alternatively, the n-type impurity may be N (nitrogen), for example. The dose amount in the ion implantation is not smaller than $1\times10^{15}$ cm$^{-2}$ and not larger than $1\times10^{17}$ cm$^{-2}$, for example. So as to make the cathode region 20 a high-concentration region, the dose amount is preferably $1\times10^{16}$ cm$^{-2}$ or larger.

After n-type impurity ions are implanted, activation annealing (the heat treatment) is performed to activate the p-type impurity and the n-type impurity. At the time of the activation annealing, the C (carbon) implanted through the ion implantation enters carbon vacancies, and the first low-carbon-vacancy-concentration region (first region) 16d, the second low-carbon-vacancy-concentration region (second region) 16e, and the third low-carbon-vacancy-concentration region (third region) 16f are formed in the drift layer 16.

So as to reduce carbon vacancies, the activation annealing is preferably performed at 1450° C. or higher, and more preferably, at 1550° C. or higher. The activation annealing is performed in an inert gas atmosphere, for example. If the temperature in the activation annealing is too high, the equilibrium concentration of carbon vacancies becomes higher. Therefore, the activation annealing is preferably performed at 1700° C. or lower, and more preferably, at a lower temperature than 1620° C.

The activation annealing is performed for 30 minutes or longer but not longer than two hours, for example.

The anode electrode 12 is then formed on the anode region 18 through a known process. The cathode electrode 14 is formed on the surface of the cathode region 20, so that the PIN diode 200 of this embodiment shown in FIG. 18 is completed.

With the semiconductor device and the semiconductor device manufacturing method according to this embodiment, the rate of decrease in reverse recovery current is lowered, and soft recovery characteristics are realized, as in the first embodiment. Also, the lifetime of carriers becomes longer, and the on-state resistance becomes lower. The on-state resistance is further lowered, as the first low-carbon-vacancy-concentration region (first region) 16d is formed in the middle portion of the drift layer 16, and the second low-carbon-vacancy-concentration region (second region) 16e is formed on the side of the anode electrode 12.

By the manufacturing method according to this embodiment, the PIN diode 200 that has the thick drift layer 16, has a high breakdown voltage, and has a low on-state resistance can be readily manufactured.

Although silicon faces are bonded to each other in the above described example of this embodiment, carbon faces may be bonded to each other, or a silicon face and a carbon face may be bonded to each other, for example. Particularly, in a case where a silicon face and a carbon face are bonded to each other, the crystalline characteristics at the junction portion are excellent.

Although silicon carbide crystalline structures are 4H—SiC in the above described embodiments, the present disclosure can also be applied to silicon carbides having other crystalline structures such as 6H—SiC and 3C—SiC. Also, in the above described embodiments, an electrode is formed on a Si face or a C face. However, the present disclosure can also be applied in cases where a contact electrode is formed on an a face, an m face, or an intermediate face between those faces.

Although examples of PIN diodes have been described in the above embodiments, the present disclosure can also be applied to other bipolar devices such as IGBTs (Insulated Gate Bipolar Transistors).

While certain embodiments have been described, these embodiments have been presented by way of example only, and are not intended to limit the scope of the inventions. Indeed, the semiconductor device manufacturing method, and the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising:
    forming an n-type SiC layer on a SiC substrate;
    forming a p-type impurity region at one side of the n-type SiC layer;
    performing a first heat treatment;
    exposing another side of the n-type SiC layer by removing at least part of the SiC substrate;
    implanting carbon (C) ions into exposed part of the n-type SiC layer;
    forming an n-type impurity region on exposed part of the n-type SiC layer, an n-type impurity concentration in the n-type impurity region having a higher n-type impurity concentration than an n-type impurity concentration in the n-type SiC layer;
    performing a second heat treatment to form a low-carbon-vacancy concentration region, a temperature in the second heat treatment being lower than a temperature in the first heat treatment;
    forming a first electrode on the p-type impurity region; and
    forming a second electrode on the n-type impurity region,
    wherein the low-carbon-vacancy-concentration region is formed in a portion of the n-type SiC layer and on the side of the second electrode, and a $Z_{1/2}$ level density measured by DLTS (Deep Level Transient Spectroscopy) in the low-carbon-vacancy-concentration region is $1 \times 10^{11}$ cm$^{-3}$ or lower.

2. The method according to claim 1, wherein a temperature in the second heat treatment is 1450° C. or higher.

3. The method according to claim 1, further comprising, forming a thermally-oxidized film at the exposed part of the SiC layer after the performing the second heat treatment prior to the forming the second electrode.

4. The method according to claim 1, wherein the p-type impurity region is formed through p-type impurity ion implantation.

5. The method according to claim 3, wherein a temperature for the forming the thermally-oxidized film is not lower than 1150° C.

6. The method according to claim 1, wherein a lifetime of a minority carrier in the low-carbon-vacancy-concentration region is 5 μsec or longer.

7. The method according to claim 1, wherein the temperature in the second heat treatment is higher than the temperature when implanting carbon (C) ions into exposed part of the n-type SiC layer.

8. A semiconductor device manufacturing method comprising:
    forming an n-type SiC layer on a SiC substrate; then
    forming a p-type impurity region at one side of the n-type SiC layer; then
    exposing another side of the n-type SiC layer by removing at least part of the SiC substrate; then
    forming an n-type impurity region on exposed part of the n-type SiC layer, an n-type impurity concentration in the n-type impurity region having a higher n-type impurity concentration than an n-type impurity concentration in the n-type SiC layer; then
    performing a first heat treatment; then
    implanting carbon (C) ions into exposed part of the n-type SiC layer; then
    performing a second heat treatment to form a low-carbon-vacancy concentration region, a temperature in the second heat treatment being lower than a temperature in the first heat treatment; and then
    forming a first electrode on the p-type impurity region and a second electrode on the n-type impurity region,
    wherein the low-carbon-vacancy-concentration region is formed in a portion of the n-type SiC layer and on the side of the second electrode, and a $Z_{1/2}$ level density measured by DLTS (Deep Level Transient Spectroscopy) in the low-carbon-vacancy-concentration region is $1 \times 10^{11}$ cm$^{-3}$ or lower.

9. The method according to claim 8, wherein a temperature in the second heat treatment is 1450° C. or higher.

10. The method according to claim 8, wherein the p-type impurity region is formed through p-type impurity ion implantation.

11. The method according to claim 8, wherein a lifetime of a minority carrier in the low-carbon-vacancy-concentration region is 5 μsec or longer.

12. The method according to claim 8, wherein the temperature in the second heat treatment is higher than the temperature when implanting carbon (C) ions into exposed part of the n-type SiC layer.

* * * * *